United States Patent
Zhang et al.

(10) Patent No.: US 12,211,406 B2
(45) Date of Patent: Jan. 28, 2025

(54) DISPLAY PANEL HAVING CRACK DETECTION CIRCUIT WITH CONDUCTION LOOP, DISPLAY APPARATUS, AND METHOD OF DETECTING CRACK IN DISPLAY PANEL

(71) Applicants: Chengdu BOE Optoelectronics Technology Co., Ltd., Sichuan (CN); BOE Technology Group Co., Ltd., Beijing (CN)

(72) Inventors: Shun Zhang, Beijing (CN); Yuanqi Zhang, Beijing (CN); Ping Wen, Beijing (CN); Fan He, Beijing (CN); Yi Zhang, Beijing (CN); Yu Wang, Beijing (CN); Yang Zeng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/606,432

(22) PCT Filed: Jan. 15, 2021

(86) PCT No.: PCT/CN2021/072262
§ 371 (c)(1),
(2) Date: Oct. 25, 2021

(87) PCT Pub. No.: WO2022/151392
PCT Pub. Date: Jul. 21, 2022

(65) Prior Publication Data
US 2023/0134939 A1    May 4, 2023

(51) Int. Cl.
*G09G 3/00* (2006.01)

(52) U.S. Cl.
CPC ..... *G09G 3/006* (2013.01); *G09G 2300/0426* (2013.01); *G09G 2330/12* (2013.01)

(58) Field of Classification Search
CPC .............. G01M 5/0033; G01M 5/0083; G09G 2300/0426; G09G 2330/12; G09G 3/006;
(Continued)

(56) References Cited

U.S. PATENT DOCUMENTS

| 10,282,003 | B2 * | 5/2019 | Park ....................... H10K 59/40 |
| 10,997,883 | B2 * | 5/2021 | Kang ..................... G09G 3/006 |

(Continued)

FOREIGN PATENT DOCUMENTS

| CN | 108172593 A | 6/2018 |
| CN | 109752421 A | 5/2019 |

(Continued)

OTHER PUBLICATIONS

International Search Report & Written Opinion mailed Oct. 11, 2021, regarding PCT/CN2021/072262.
(Continued)

*Primary Examiner* — Vinh P Nguyen
(74) *Attorney, Agent, or Firm* — Intellectual Valley Law, P.C.

(57) ABSTRACT

A display panel is provided. The display panel includes display elements in a display area; a touch electrode layer at least partially in the display area, wherein the display elements and the touch electrode layer are absent in a window region that is at least partially surrounded by the display area and a crack detection circuit. The crack detection circuit includes an integrated circuit; and a first conduction loop electrically connected to the integrated circuit. The first conduction loop includes a window region crack detection line substantially surrounding the window region; and at least a portion of the first conduction loop includes a (Continued)

first metal line in a first layer and a second metal line in a second layer, the first metal line connected to the second metal line through a via extending through a touch insulating layer.

19 Claims, 33 Drawing Sheets

(58) Field of Classification Search
CPC ........... G09G 2310/04; G09G 2354/00; G09G 3/3426; G09G 3/36; G09G 5/00; G09G 5/38; G09G 3/32; G09G 3/3208; H10K 59/00; H10K 59/131; G06F 1/1643; G06F 1/1652; G06F 3/0412; G06F 3/041; G06F 2203/04102; G06F 1/1684; G06F 3/0443; G06F 2203/04104; G06F 18/217; G06F 3/0416; G01R 27/2623; G01R 31/00; G01R 31/2829; G01R 31/2843; G01R 31/52
See application file for complete search history.

(56) References Cited

U.S. PATENT DOCUMENTS

| | | | | |
|---|---|---|---|---|
| 11,276,351 | B2* | 3/2022 | Lee | H10K 59/40 |
| 11,360,625 | B2* | 6/2022 | Deng | G06F 3/04164 |
| 11,640,218 | B2* | 5/2023 | Zhang | G06F 3/0418 |
| | | | | 345/173 |
| 11,961,432 | B2* | 4/2024 | Jung | G01M 5/0033 |
| 2013/0082843 | A1 | 4/2013 | Wurzel et al. | |
| 2018/0166525 | A1 | 6/2018 | Kim et al. | |
| 2019/0027076 | A1 | 1/2019 | Lee et al. | |
| 2020/0133415 | A1 | 4/2020 | Choi et al. | |
| 2020/0143722 | A1 | 5/2020 | Lee et al. | |
| 2020/0161406 | A1 | 5/2020 | Lee et al. | |
| 2020/0173949 | A1 | 6/2020 | Lee et al. | |
| 2020/0175901 | A1* | 6/2020 | Lee | G09G 3/006 |
| 2020/0273919 | A1 | 8/2020 | Ding et al. | |
| 2020/0410913 | A1 | 12/2020 | Wu | |
| 2022/0209187 | A1* | 6/2022 | Bok | H10K 50/844 |

FOREIGN PATENT DOCUMENTS

| | | |
|---|---|---|
| CN | 109872634 A | 6/2019 |
| CN | 109901747 A | 6/2019 |
| CN | 109979366 A | 7/2019 |
| CN | 110634411 A | 12/2019 |
| CN | 111048021 A | 4/2020 |
| CN | 111106143 A | 5/2020 |
| CN | 111106151 A | 5/2020 |
| CN | 111128064 A | 5/2020 |
| CN | 111146247 A | 5/2020 |
| CN | 111189618 A | 5/2020 |
| CN | 111398355 A | 7/2020 |
| CN | 111509026 A | 8/2020 |

OTHER PUBLICATIONS

First Office Action in the Chinese Patent Application No. 202120110662.X, dated Jul. 7, 2021; English translation attached.
The Extended European Search Report in the European Patent Application No. 21918596.4, dated May 3, 2023.

* cited by examiner

 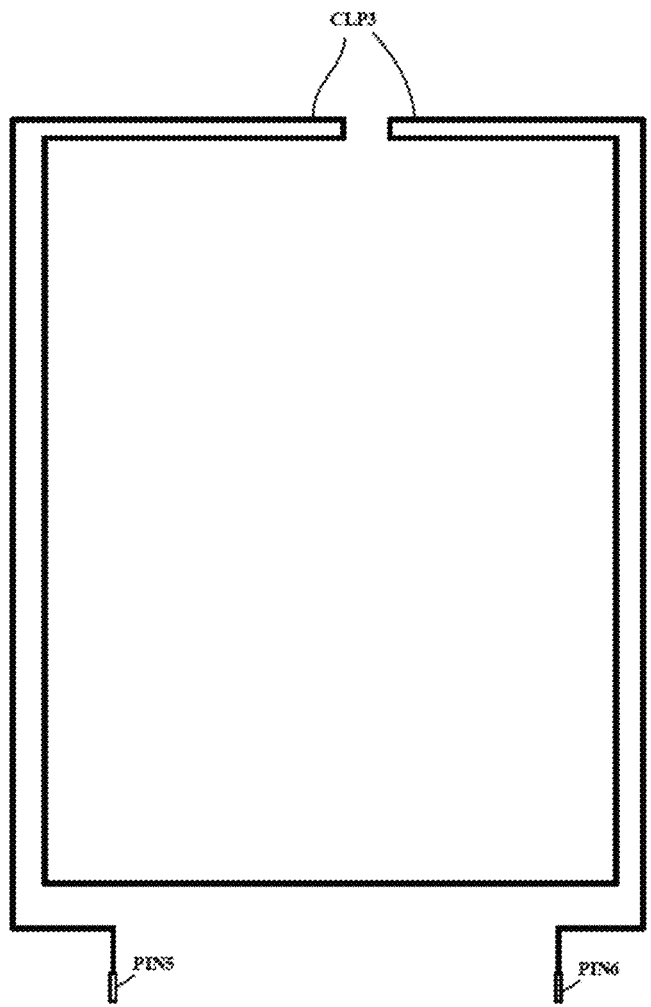
FIG. 5G
FIG. 5H

DISPLAY PANEL HAVING CRACK DETECTION CIRCUIT WITH CONDUCTION LOOP, DISPLAY APPARATUS, AND METHOD OF DETECTING CRACK IN DISPLAY PANEL

CROSS-REFERENCE TO RELATED APPLICATION

This application is a national stage application under 35 U.S.C. § 371 of International Application No. PCT/CN2021/072262, filed Jan. 15, 2021, the contents of which are incorporated by reference in the entirety.

TECHNICAL FIELD

The present invention relates to the field of display technology, more particularly, to a display panel, a display apparatus, and a method of detecting crack in a display panel.

BACKGROUND

Various types of touch panels have been developed. Examples of touch panels include one-glass-solution (OGS) touch panels, on-cell touch panels, and in-cell touch panels. The on-cell touch panels provide high touch control accuracy. The on-cell touch panels can be classified into single-layer-on-cell (SLOC) touch panels and multi-layer-on-cell (MLOC) touch panels. In particular, multiple point touch control can be achieved in the MLOC touch panels with superior touch control accuracy and blanking effects.

SUMMARY

In one aspect, the present disclosure provides a display panel, comprising display elements in a display area; a touch electrode layer at least partially in the display area, wherein the display elements and the touch electrode layer are absent in a window region that is at least partially surrounded by the display area; and a crack detection circuit; wherein the crack detection circuit comprising an integrated circuit; and a first conduction loop electrically connected to the integrated circuit wherein the first conduction loop comprises a window region crack detection line substantially surrounding the window region; and at least a portion of the first conduction loop comprises a first metal line in a first layer and a second metal line in a second layer, the first metal line connected to the second metal line through a via extending through a touch insulating layer.

Optionally, the window region crack detection line comprises contiguously a first line portion extending clock-wisely around a first section of a periphery of the window region, a second line portion extending counter-clock-wisely around the first section of the periphery of the window region and a second section of the periphery of the window region, and a third line portion extending clock-wisely around the second section of the periphery of the window region.

Optionally, the window region crack detection line comprises contiguously a first line portion extending counter-clock-wisely around a first section of a periphery of the window region, a second line portion extending clock-wisely around the first section of the periphery of the window region and a second section of the periphery of the window region, and a third line portion extending counter-clock-wisely around the second section of the periphery of the window region.

Optionally, the first conduction loop further comprises a first touch crack detection line and a second touch crack detection line respectively electrically connected to a first terminal and a second terminal of the window region crack detection line; the first touch crack detection line extends from a first sub-area through a second sub-area into a third sub-area of a peripheral area of the display panel; the second touch crack detection line extends from the third sub-area through the second sub-area back into the first sub-area; and the first touch crack detection line and the second touch crack detection line are at least partially in the second layer, the second layer further comprising mesh blocks of the touch electrode layer.

Optionally, the first touch crack detection line and the second touch crack detection line are on a same side relative to the display area.

Optionally, the first conduction loop further comprises a first connecting mesh block and a second connecting mesh block respectively electrically connected to a first terminal and a second terminal of a window region crack detection line; the first connecting mesh block and the second connecting mesh block respectively extend through a portion of a touch control area of the display panel; and the first connecting mesh block and the second connecting mesh block are in the second layer, the second layer further comprising mesh blocks of the touch electrode layer.

Optionally, a contour of at least one of the first connecting mesh block or the second connecting mesh block has an undulating shape or a zig-zag shape; and at least one of the first connecting mesh block or the second connecting mesh block is internal to a mesh block of the touch electrode layer or between adjacent mesh blocks of the touch electrode layer.

Optionally, the first conduction loop further comprises a first lead line connecting the first terminal of the window region crack detection line to the first connecting mesh block and a second lead line connecting the second terminal of the window region crack detection line to the second connecting mesh block; the first lead line and the second lead line are in the first layer spaced apart from the second layer by the touch insulating layer; the first lead line connects to the first connecting mesh block through a via extending through the touch insulating layer; and the second lead line connects to the second connecting mesh block through a via extending through the touch insulating layer.

Optionally, the display panel further comprises mesh blocks respectively around the window region, conductive plates respectively connected to the mesh blocks, and conductive bridges, wherein a respective conductive plate directly connected to one or more mesh lines of a respective mesh block, and a respective conductive bridge connecting two adjacent conductive plates; wherein the first lead line and the second lead line respectively cross over at least one of a conductive plate or a conductive bridge.

Optionally, the first conduction loop further comprises a third lead line connecting the first connecting mesh block to a first touch crack detection line and a fourth lead line connecting the second connecting mesh block to a second touch crack detection line, the first touch crack detection line and the second touch crack detection line being at least partially in the second layer and in a peripheral area of the display panel, the third lead line and the fourth lead line being in the first layer spaced apart from the second layer by the touch insulating layer; the third lead line connects to the first connecting mesh block through a via extending through the touch insulating layer; and the fourth lead line connects to the second connecting mesh block through a via extending through the touch insulating layer.

Optionally, the first touch crack detection line, the second touch crack detection line, the window region crack detection line are parts of a first touch crack sub-loop that continuously extends from a first sub-area of a peripheral area into an area substantially surrounding the window region, and then extends from the area substantially surrounding the window region back to the first sub-area.

Optionally, the first conduction loop further comprises a first panel crack sub-loop that continuously extends from a first sub-area of a peripheral area into a third sub-area of the peripheral area of the display panel, and then extends from the third sub-area back to the first sub-area; and a first touch crack detection line and a second touch crack detection line respectively electrically connected to a first terminal and a second terminal of a window region crack detection line; wherein a first terminal of the first panel crack sub-loop is connected to the second touch crack detection line; a second terminal of the first panel crack sub-loop is connected to the integrated circuit; the first touch crack detection line and the second touch crack detection line space apart the first panel crack sub-loop and the display area; the first touch crack detection line extends from a first sub-area through a second sub-area into a third sub-area of a peripheral area of the display panel; and the second touch crack detection line extends from the third sub-area through the second sub-area back into the first sub-area.

Optionally, the first touch crack detection line and the second touch crack detection line are in the second layer, the second layer further comprising mesh blocks of the touch electrode layer; and the first panel crack sub-loop is in a layer in a thin film transistor array substrate.

Optionally, the crack detection circuit further comprises a first connecting line connecting the first touch crack detection line to a source electrode of a switching transistor, a drain electrode of the switching transistor connected to a data line.

Optionally, the second terminal of the first panel crack sub-loop is connected to a first pin in the integrated circuit, which is in turn connected to a second pin in a bonding area for bonding a flexible printed circuit.

Optionally, the crack detection circuit further comprises a second conduction loop electrically connected to the integrated circuit; the second conduction loop comprises a third touch crack detection line and a fourth touch crack detection line; the first conduction loop and the second conduction loop are spaced apart from each other, at least a portion of the first conduction loop and at least a portion of the second conduction loop are on opposite sides relative to the display area; the third touch crack detection line and the fourth touch crack detection line respectively extend from a first sub-area through a fourth sub-area into a third sub-area of a peripheral area of the display panel; the third touch crack detection line and the fourth touch crack detection line are connected to each other in the third sub-area; and the third touch crack detection line and the fourth touch crack detection line are at least partially in the second layer, the second layer further comprising mesh blocks of the touch electrode layer.

Optionally, the second conduction loop further comprises a second panel crack sub-loop that continuously extends from the first sub-area through the fourth sub-area into the third sub-area of a peripheral area of the display panel and back to the first sub-area; wherein a first terminal of the second panel crack sub-loop is connected to the fourth touch crack detection line; a second terminal of the second panel crack sub-loop is connected to the integrated circuit; and the second panel crack sub-loop is in a layer in a thin film transistor array substrate.

Optionally, the display panel further comprises a second connecting line connecting the third touch crack detection line to a source electrode of a switching transistor, a drain electrode of the switching transistor connected to a data line.

Optionally, the second terminal of the second panel crack sub-loop is connected to a third pin in the integrated circuit, which is in turn connected to a fourth pin in a bonding area for bonding a flexible printed circuit.

Optionally, the crack detection circuit further comprises a third conduction loop continuously extending, sequentially, from a first corner region of a first sub-area, to a second sub-area, to a third sub-area, to the second sub-area, to the first sub-area, to a fourth sub-area, to the third sub-area, to the fourth sub-area, and back to a second corner region of the first sub-area; the first sub-area, the second sub-area, the third sub-area, and the fourth sub-area are respectively sub-areas of a peripheral area in the display panel; a first terminal and a second terminal of the third conduction loop are respectively connected to two bonding pins in a bonding area for bonding a flexible printed circuit; and the first conduction loop and the second conduction loop space apart the third conduction loop from the display area.

In another aspect, the present disclosure provides a display apparatus, comprising the display panel described herein or fabricated by a method described herein, and a flexible printed circuit connected to the integrated circuit.

Optionally, the crack detection circuit further comprises a third conduction loop continuously extending, sequentially, from a first corner region of a first sub-area, to a second sub-area, to a third sub-area, to the second sub-area, to the first sub-area, to a fourth sub-area, to the third sub-area, to the fourth sub-area, and back to a second corner region of the first sub-area; the first sub-area, the second sub-area, the third sub-area, and the fourth sub-area are respectively sub-areas of a peripheral area in the display panel; and a first terminal and a second terminal of the third conduction loop are respectively connected to two bonding pins bonded to the flexible printed circuit.

Optionally, the first conduction loop further comprises a first panel crack sub-loop that continuously extends from a first sub-area of a peripheral area into a third sub-area of a peripheral area of the display panel and hack to the first sub-area; a first touch crack detection line and a second touch crack detection line respectively electrically connected to a first terminal and a second terminal of a window region crack detection fine; a first terminal of the first panel crack sub-loop is connected to the second touch crack detection line; a second terminal of the first panel crack sub-loop is connected to a first pin in the integrated circuit, which is in turn connected to a second pin, the second pin bonded to the flexible printed circuit; and the first touch crack detection line and the second touch crack detection line respectively extend from a first sub-area through a second sub-area into a third sub-area of a peripheral area of the display panel.

In another aspect, the present disclosure provides a method of detecting crack in a display panel comprising display elements in a display area; a touch electrode layer at least partially in the display area, wherein the display elements and the touch electrode layer are absent in a window region that is at least partially surrounded by the display area, the method comprising providing a first conduction loop; electrically connecting a first terminal of the first conduction loop to an integrated circuit; electrically connecting a second terminal of the first conduction loop to a source electrode of a switching transistor; electrically connecting a drain electrode of the switching transistor to a data line; providing, by the integrated circuit, a voltage signal to the first terminal of the first conduction loop while turning on the switching transistor; and determining presence or absence of a crack in is region having the first conduction loop based on light emitting status of light emitting elements connected to the data line; wherein providing the first conduction loop comprises extending a window region crack detection line of the first conduction loop into a region substantially surrounding the window region; and determining presence or absence of the crack comprises determining presence or absence of a crack in the region substantially surrounding the window region.

Optionally, providing the first conduction loop further comprises extending a first touch crack detection line of the first conduction loop from a first sub-area through a second sub-area into a third sub-area of a peripheral area of the display panel, extending a second touch crack detection line of the first conduction loop from the third sub-area through the second sub-area into the first sub-area; and determining presence or absence of the crack further comprises determining presence or absence of a crack in a touch control structure in the first sub-area, the second sub-area, and the third sub-area.

Optionally, providing the first conduction loop further comprises extending a first panel crack sub-loop of the first conduction loop from a first sub-area of a peripheral area through a second sub-area into a third sub-area of a peripheral area of the display panel and back to the first sub-area; and determining presence or absence of the crack further comprises determining presence or absence of a crack in a thin film transistor array substrate in the first sub-area, the second sub-area, and the third sub-area.

Optionally, the method further comprises providing a second conduction loop; electrically connecting a first terminal of the second conduction loop to an integrated circuit; electrically connecting a second terminal of the second conduction loop to a source electrode of a switching transistor; electrically connecting a drain electrode of the switching transistor to a data line; providing, by the integrated circuit, a voltage signal to the first terminal of the second conduction loop while turning on the switching transistor; and determining presence or absence of a crack in a region having the second conduction loop based on light emitting status of light emitting elements connected to the data line; wherein providing the second conduction loop comprises extending a third touch crack detection line of the second conduction loop from a first sub-area through a fourth sub-area into a third sub-area of a peripheral area of the display panel, and extending a second touch crack detection line of the fourth conduction loop from the third sub-area through the fourth sub-area into the first sub-area; and determining presence or absence of the crack further comprises determining presence or absence of a crack in a touch control structure in the first sub-area, the fourth sub-area, and the third sub-area.

Optionally, providing the second conduction loop further comprises extending a second panel crack sub-loop of the second conduction loop from a first sub-area of a peripheral area, through a fourth sub-area into a third sub-area of a peripheral area of the display panel and back to the first sub-area; and determining presence or absence of the crack further comprises determining presence or absence of a crack in a thin film transistor array substrate in the first sub-area, the fourth sub-area, and the third sub-area.

Optionally, the method further comprises providing a third conduction loop continuously extending, sequentially, from a first corner region of a first sub-area, to a second sub-area, to a third sub-area, to the second sub-area, to the first sub-area, to a fourth sub-area, to the third sub-area, to the fourth sub-area, and back to a second corner region of the first sub-area; wherein the first sub-area, the second sub-area, the third sub-area, and the fourth sub-area are respectively sub-areas of a peripheral area in the display panel; and determining presence or absence of the crack further comprises measuring a resistance of the third conduction loop.

Optionally, the method further comprises respectively connecting a first terminal and a second terminal of the third conduction loop to two bonding pins that are bonded to a flexible printed circuit.

BRIEF DESCRIPTION OF THE FIGURES

The following drawings are merely examples for illustrative purposes according to various disclosed embodiments and axe not intended to limit the scope of the present invention.

FIG. 5G is a schematic diagram illustrating the structure of a second panel crack sub-loop in some embodiments according to the present disclosure.

FIG. 5H is a schematic diagram illustrating the structure of a third conduction loop in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display panel, a display apparatus, and a method of detecting crack in a display panel that substantially obviate one or more of the problems due to limitations and disadvantages of the related art. In one aspect, the present disclosure provides a display panel. In some embodiments, the display panel includes display elements in a display area; a touch electrode layer at least partially in the display area, wherein the display elements and the touch electrode layer are absent in a window region that is at least partially surrounded by the display area; and a crack detection circuit. In some embodiments, the crack detection circuit includes an integrated circuit; and a first conduction loop electrically connected to the integrated circuit. Optionally, the first conduction loop includes a window region crack detection line substantially surrounding the window region. Optionally, at least a portion of the first conduction loop comprises a first metal line in a first layer and a second metal line in a second layer, the first metal line connected to the second metal line through a via extending through a touch insulating layer.

Figure 1:
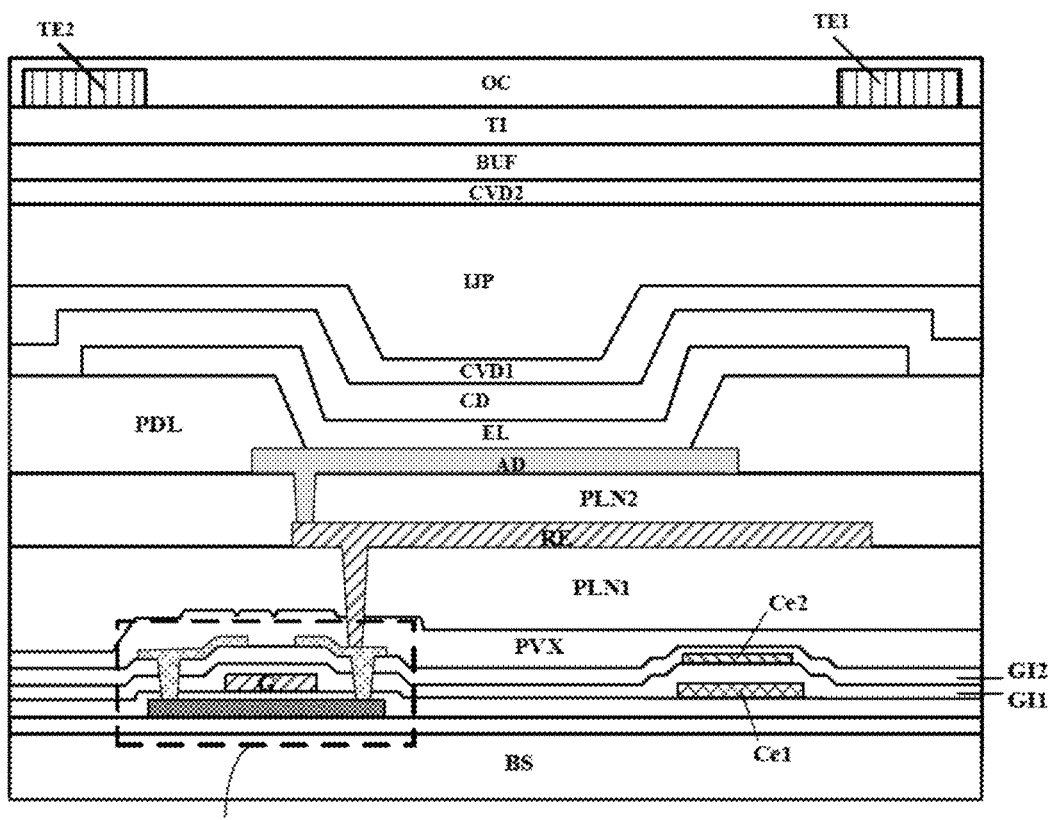
FIG. 1 is a cross sectional view of a display panel in some embodiments according to the present disclosure.

FIG. 1 is a cross sectional view of a display panel in some embodiments according to the present disclosure. Referring to FIG. 1, in the display area, the display panel includes a base substrate BS, a plurality of thin film transistors TFT on the base substrate BS, a passivation layer PVX on a side of the plurality of thin film transistors TFT away from the base substrate BS, a first planarization layer PLN1 on a side of the passivation layer PVX away from the base substrate BS, a relay electrode RE on a side of the first planarization layer PLN1 away from the passivation layer PVX, a second planarization layer PLN2 on a side of the relay electrode RE away from the first planarization layer PLN1, a pixel definition layer PDL on a side of the second planarization layer PLN2 away from the first planarization layer PLN1 and defining subpixel apertures, an anode AD on a side of the second planarization layer PLN2 away from the first planarization layer PLN1, a light emitting layer EL on a side of the anode AD away from the second planarization layer PLN2, a cathode CD on a side of the light emitting layer EL away from the anode AD, a first inorganic encapsulating layer CVD1 on a side of the cathode CD away from light emitting layer EL, an organic encapsulating layer IJP on a side of the first inorganic encapsulating layer CVD1 away from the cathode CD, a second inorganic encapsulating layer CVD2 on a side of the organic encapsulating layer IJP away from the first inorganic encapsulating layer CVD1, a buffer layer BUF on a side of the second inorganic encapsulating layer CVD2 away from the organic encapsulating layer IJP, a touch insulating layer TI on a side of the buffer layer BUF away from the second inorganic encapsulating layer CVD2, touch electrodes (e.g., the plurality of first touch electrodes TE1 and the plurality of second touch electrodes TE2 as shown in FIG. 2) on a side of the touch insulating layer TI away from the buffer layer BUF, and an overcoat layer OC on a side of the touch electrodes away from the touch insulating layer TI.

Figure 2:
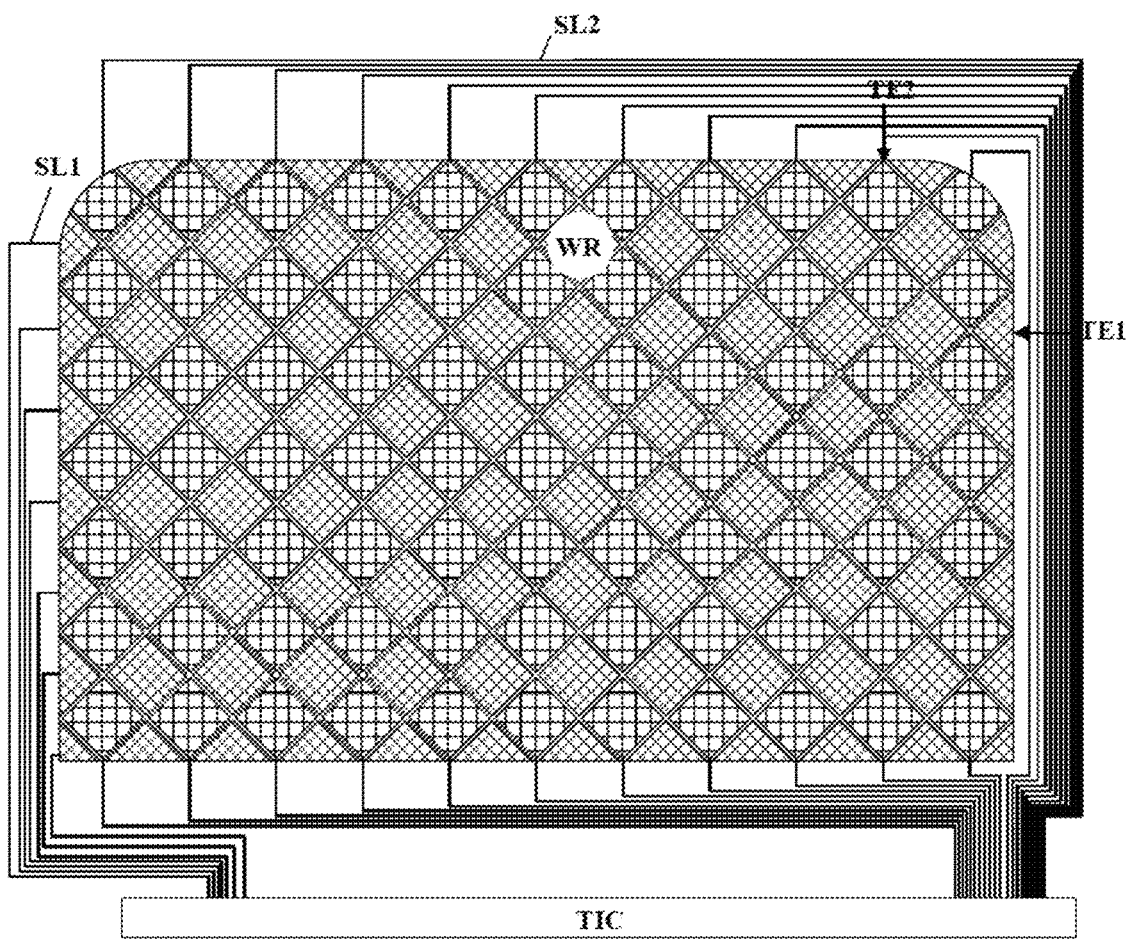
FIG. 2 is a schematic diagram illustrating the structure of a display panel having a touch control structure in some embodiments according to the present disclosure.

FIG. 2 is a schematic diagram illustrating the structure of a display panel having a touch control structure in some embodiments according to the present disclosure. In some embodiments, the touch control structure further includes a plurality of first touch signal lines SL1 respectively connected to the plurality of first mesh electrodes TE1, and a plurality of second touch signal lines SL2 respectively connected to the plurality of second mesh electrodes TE2. The display panel further includes a touch control driving integrated circuit TIC. The plurality of first touch signal lines SL1 and the plurality of second touch signal lines SL2 are connected to the touch control driving integrated circuit TIC.

Figure 3A:
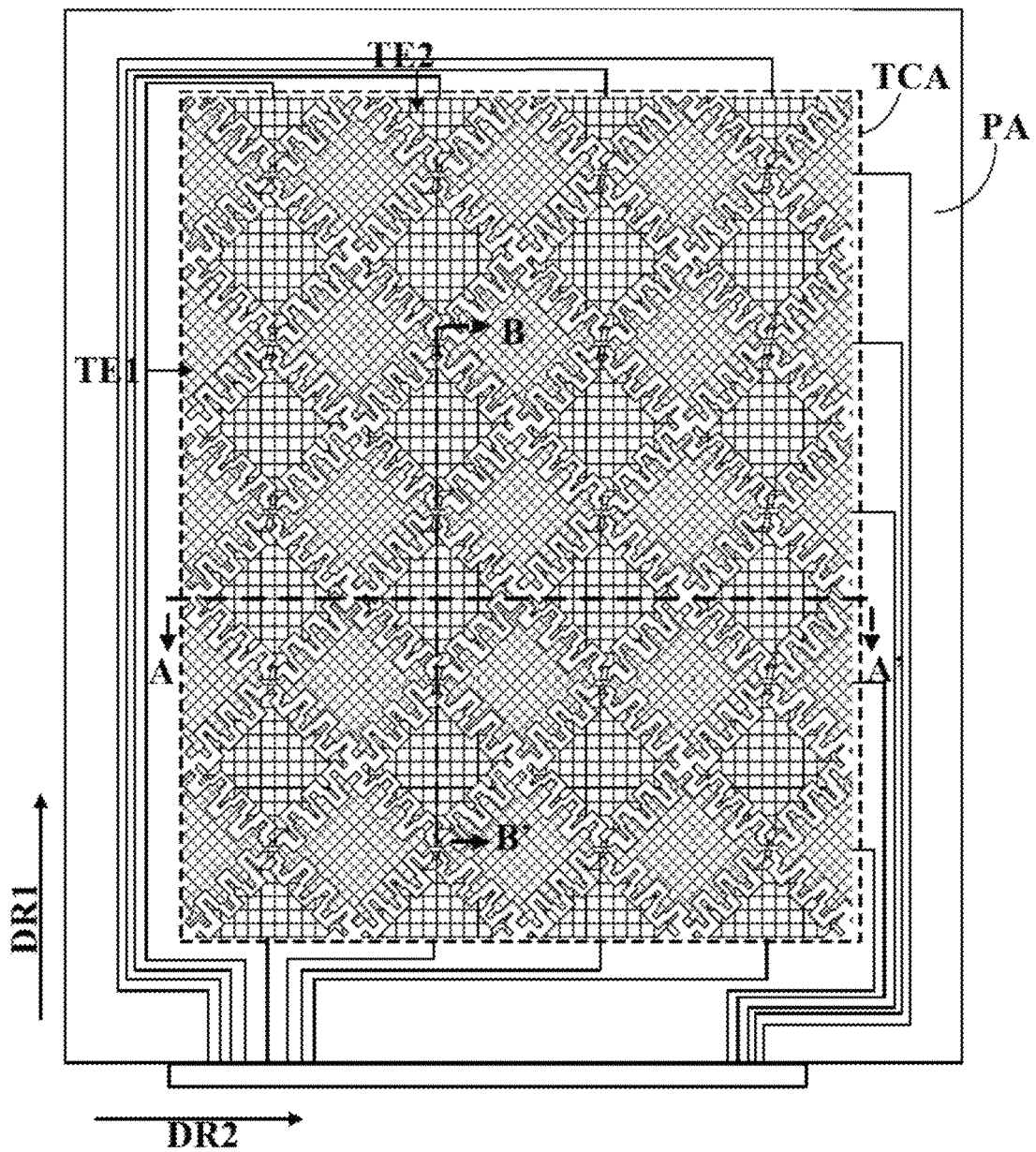
FIG. 3A is a schematic diagram illustrating the structure of a touch control structure in some embodiments according to the present disclosure.

FIG. 3A is a schematic diagram illustrating the structure of a touch control structure in a display panel in some embodiments according to the present disclosure. Referring to FIG. 3A, the touch control structure in some embodiments includes a plurality of first mesh electrodes TE1 arranged in a plurality of rows and a plurality of second mesh electrodes TE2 arranged in a plurality of columns. Adjacent rows of the plurality of rows are isolated from each other. Adjacent columns of the plurality of columns are isolated from each other. Optionally, the touch control structure is a mutual capacitance type touch control structure. Optionally, the plurality of first mesh electrodes TE1 are a plurality of touch sensing electrodes, and the plurality of second mesh electrodes TE2 are a plurality of touch scanning electrodes. Optionally, the plurality of first mesh electrodes TE1 are a plurality of touch scanning electrodes, and the plurality of second mesh electrodes TE2 are a plurality of touch sensing electrodes.

In some embodiments, the respective one of the plurality of first mesh electrodes TE1 extends along a second direction DR2; and the respective one of the plurality of second mesh electrodes TE2 extends along a first direction DR1. Optionally, the first direction DR1 and the second direction DR2 are two non-parallel directions, for example, the first direction DR1 and the second direction DR2 cross over each other. Optionally, the first direction DR1 and the second direction DR2 are perpendicular to each other. Optionally, the first direction DR1 and the second direction DR2 cross over each other at an inclined angle that is not 90 degrees.

Figure 3B:
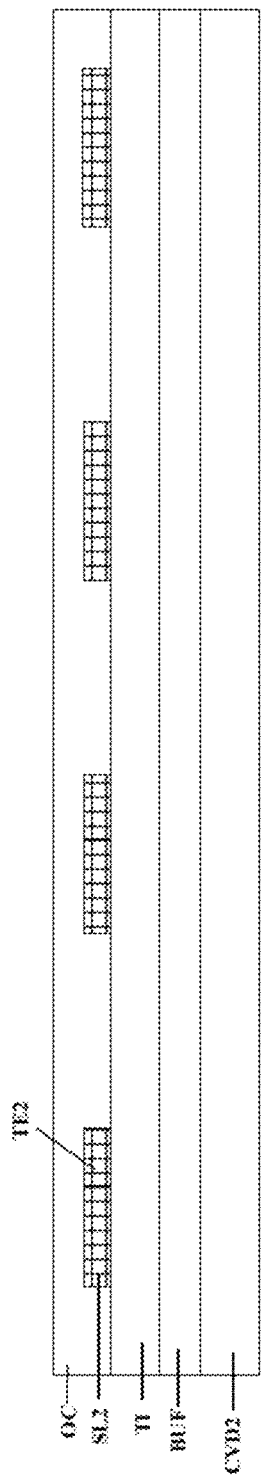
FIG. 3B is a cross-sectional view along an A-A' line in FIG. 3A.
Figure 3C:
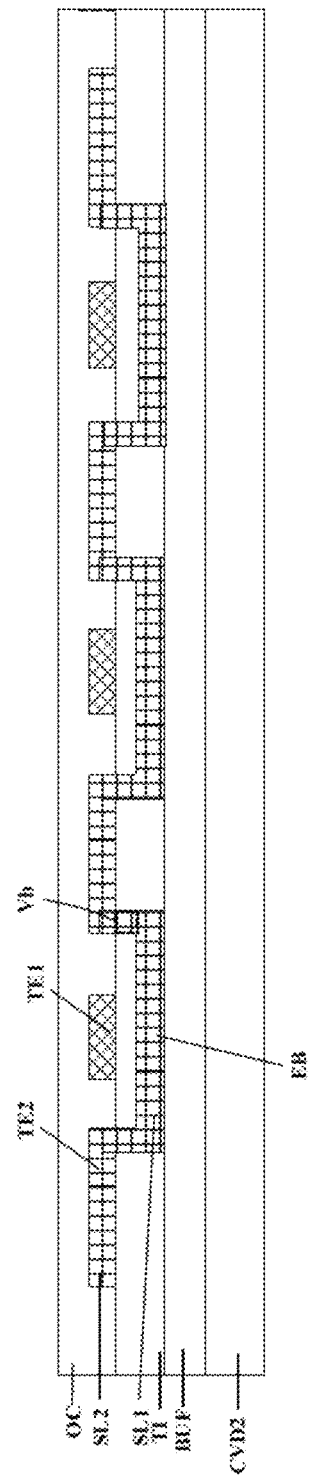
FIG. 3C is a cross-sectional view along a B-B' line in FIG. 3A.

FIG. 3B is a cross-sectional view along an A-A' line in FIG. 3A. FIG. 3C is a cross-sectional view along a B-B' line in FIG. 3A. As shown in FIG. 3A, FIG. 3B, and FIG. 3C, in some embodiments, the touch control structure includes a plurality of first mesh electrodes TE1 arranged in a plurality of rows and a plurality of second mesh electrodes TE2 arranged in a plurality of columns. The plurality of first mesh electrodes TE1 and the plurality of second mesh electrodes TE2 are in the second layer SL2. The touch control structure further includes a plurality of touch electrode bridges EB in the first layer SL1; and vias Vb extending through the touch insulating layer TI. Optionally, the plurality of touch electrode bridges EB respectively extend through the vias Vb to respectively connect adjacent second mesh blocks in a respective column of the plurality of column of the plurality of second mesh electrodes TE2.

Figure 4:
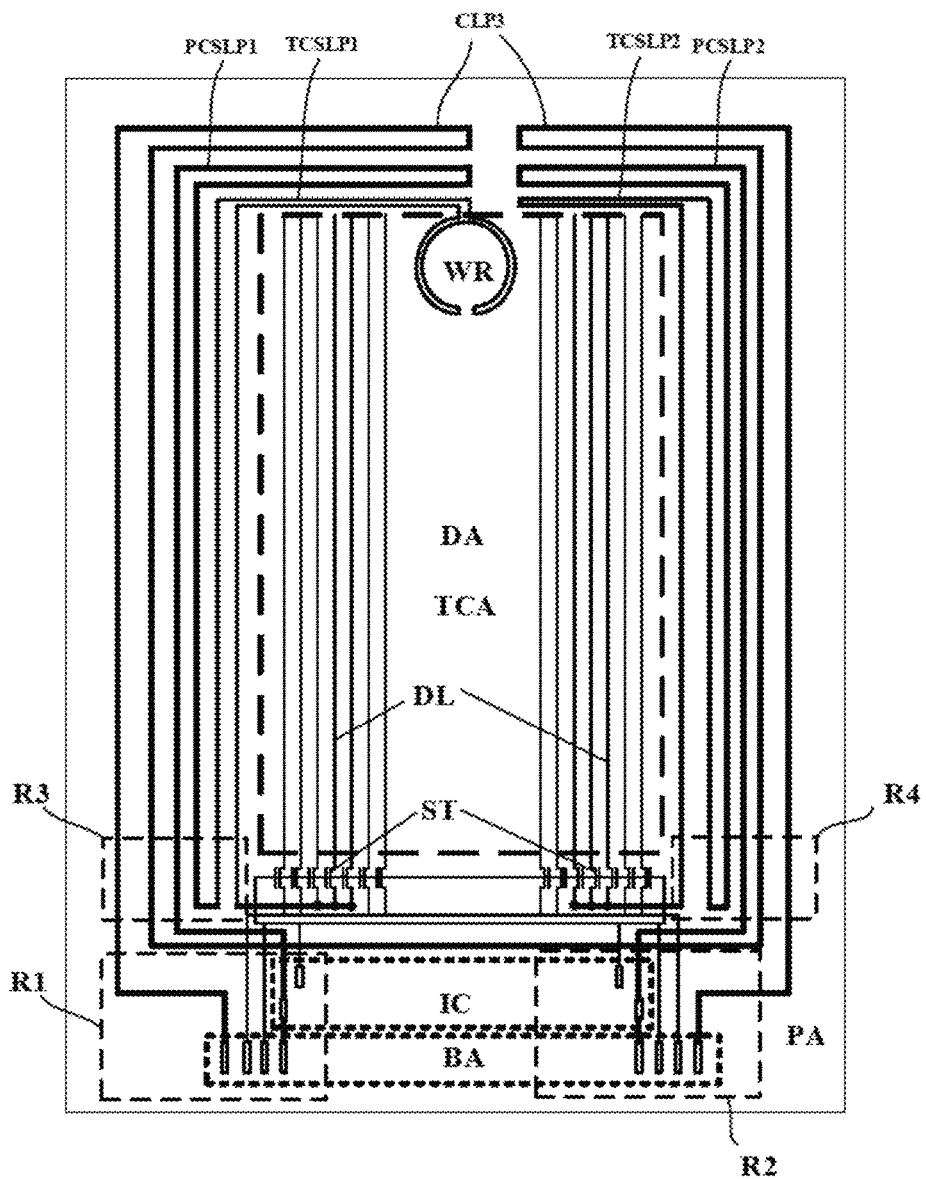
FIG. 4 is a diagram illustrating the structure of a display panel in some embodiments according to the present disclosure.

FIG. 4 is a diagram illustrating the structure of a display panel in some embodiments according to the present disclosure. Referring to FIG. 2 and FIG. 4, in some embodiments, the display elements are limited in a display area DA and absent in a window region WR substantially surrounded by the display area DA. Optionally, the touch control structure is limited in a touch control area TCA and absent in a window region WR substantially surrounded by the touch control area TCA. For example, the touch control structure may be a touch control structure in a display panel, where the touch control area TCA substantially overlaps with a display area of the display panel, and the window region WR is a region in the display panel having a hole configured for installing an accessory such as a camera lens or a fingerprint sensor. The display panel is configured to display an image in at least a portion of the touch control area TCA. In one example, in the window region WR, display elements of the display panel and the touch control structure are absent; in the display area or at least a portion of the touch control area TCA, both display elements of the display panel and the touch control structure are present.

As used herein, the term "display area" refers to an area of a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

In some embodiments, the present display panel further includes a crack detection circuit. The crack detection circuit according to the present disclosure can not only detect cracks in the display area DA, but also in the window region. Moreover, the crack detection circuit according to the present disclosure can not only detect cracks in the thin film transistor array substrate of the display panel, but also can detect cracks independently occurring in the touch control structure or adjacent layers. The inventors of the present disclosure discover a sophisticated circuit structure that can accurately detect cracks in the display panel with exceptionally high efficiency.

Figure 5A:
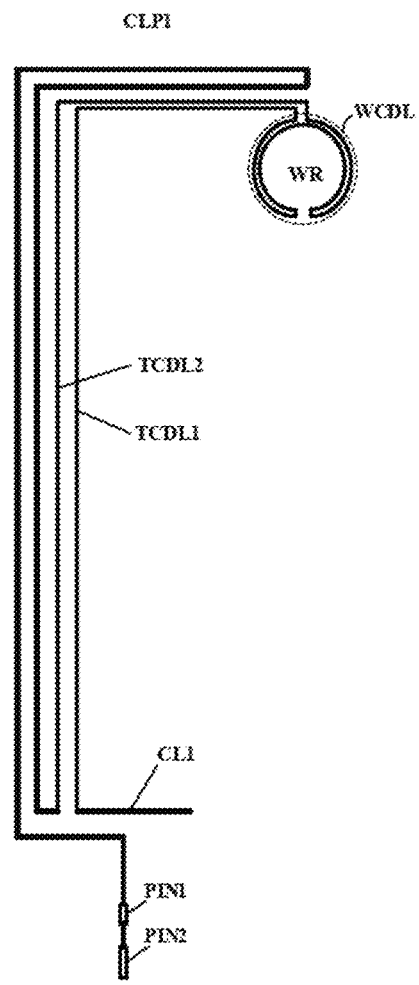
FIG. 5A is a diagram illustrating the structure of a first conduction loop in some embodiments according to the present disclosure.

FIG. 5A is a diagram illustrating the structure of a first conduction loop in some embodiments according to the present disclosure. Referring to FIG. 4 and FIG. 5A, in some embodiments, the crack detection circuit includes an integrated circuit IC; and a first conduction loop CLP1 electrically connected to the integrated circuit IC. The first conduction loop CLP1 includes a window region crack detection line WCDL substantially surrounding the window region WR. As used herein, the term substantially surrounding refers to at least 50% surrounding, e.g., at least 60% surrounding, at least 70% surrounding, at least 80% surrounding, at least 90% surrounding, at least 95% surrounding, at least 99% surrounding or at least 100% surrounding.

In some embodiments, as discussed in further details below, at least a portion of the first conduction loop includes a first metal line in a first layer and a second metal line in a second layer, the first metal line connected to the second metal line through a via extending through a touch insulating layer.

Figure 5B:
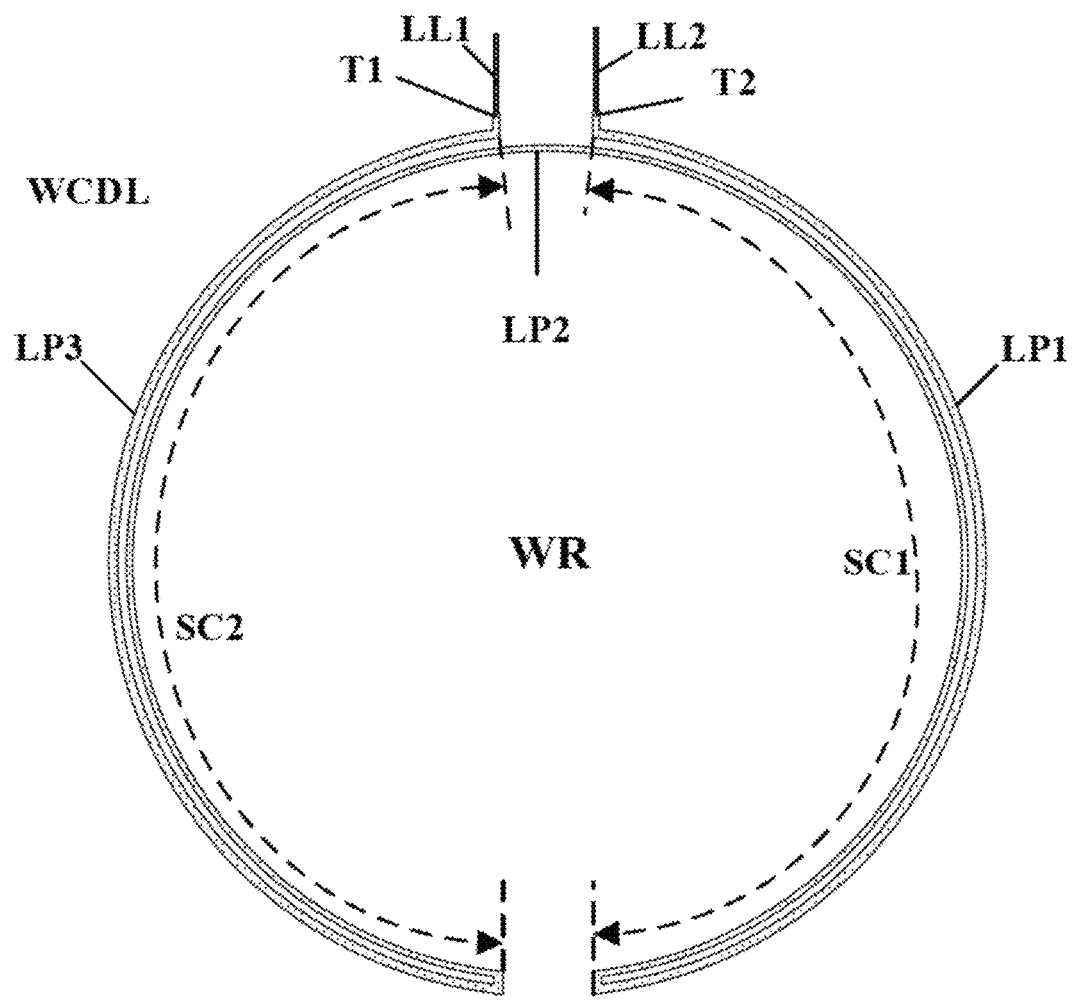
FIG. 5B is a schematic diagram illustrating the structure of a window region crack detection line in some embodiments according to the present disclosure.

FIG. 5B is a schematic diagram illustrating the structure of a window region crack detection line in some embodiments according to the present disclosure. In one example, referring to FIG. 5B, the window region crack detection line WCDL includes contiguously a first line portion LP1 extending clock-wisely around a first section SC1 (e.g., a first half) of a periphery of the window region WR, a second line portion LP2 extending counter-clock-wisely around the first section SC1 of the periphery of the window region and a second section SC2 (e.g., a second half) of the periphery of the window region WR, and a third line portion LP3 extending clock-wisely around the second section SC2 of the periphery of the window region WR.

Referring to FIG. 5A and FIG. 5B, in some embodiments, the first conduction loop CLP1 further includes a first touch crack detection line TCDL1 and a second touch crack detection line TCDL2 respectively electrically connected to a first terminal T1 and a second terminal T2 of the window region crack detection line WCDL. The first touch crack detection lisle TCDL1 and the second touch crack detection line TCDL2 are on a same side relative to the display area DA. In one example, the first touch crack detection line TCDL1 spaces apart the second touch crack detection line TCDL2 and the display area DA.

Figure 5C:
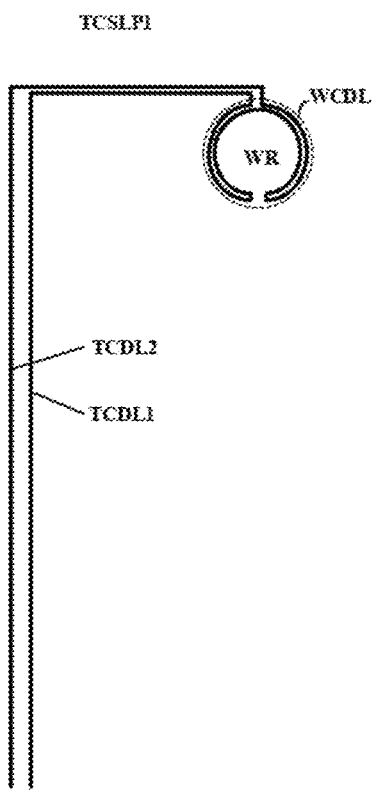
FIG. 5C is a schematic diagram illustrating the structure of a first touch crack sub-loop in some embodiments according to the present disclosure.
Figure 5D:
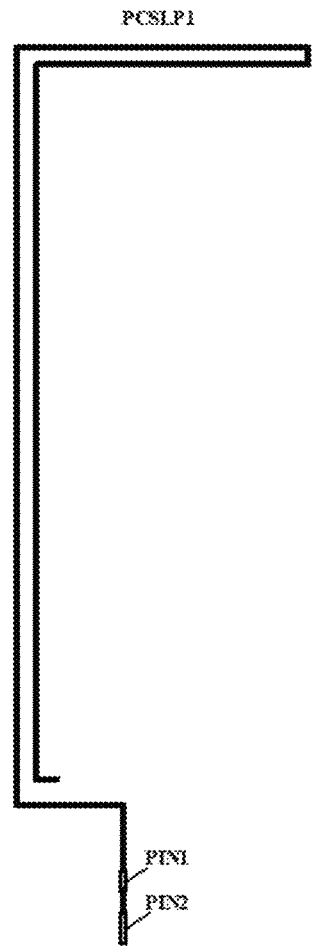
FIG. 5D is a schematic diagram illustrating the structure of a first panel crack sub-loop in some embodiments according to the present disclosure.
Figures 5E, 5F:
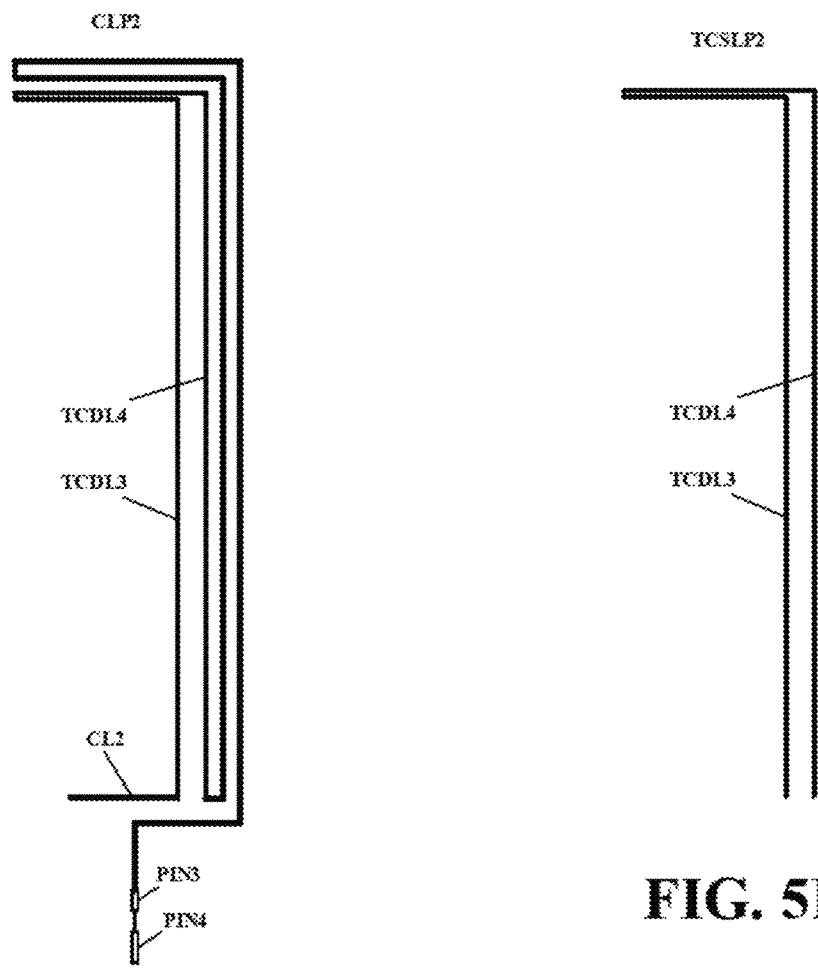
FIG. 5E is a diagram illustrating the structure of a second conduction loop in some embodiments according to the present disclosure.
FIG. 5F is a schematic diagram illustrating the structure of a second touch crack sub-loop in some embodiments according to the present disclosure.
Figure 5I:
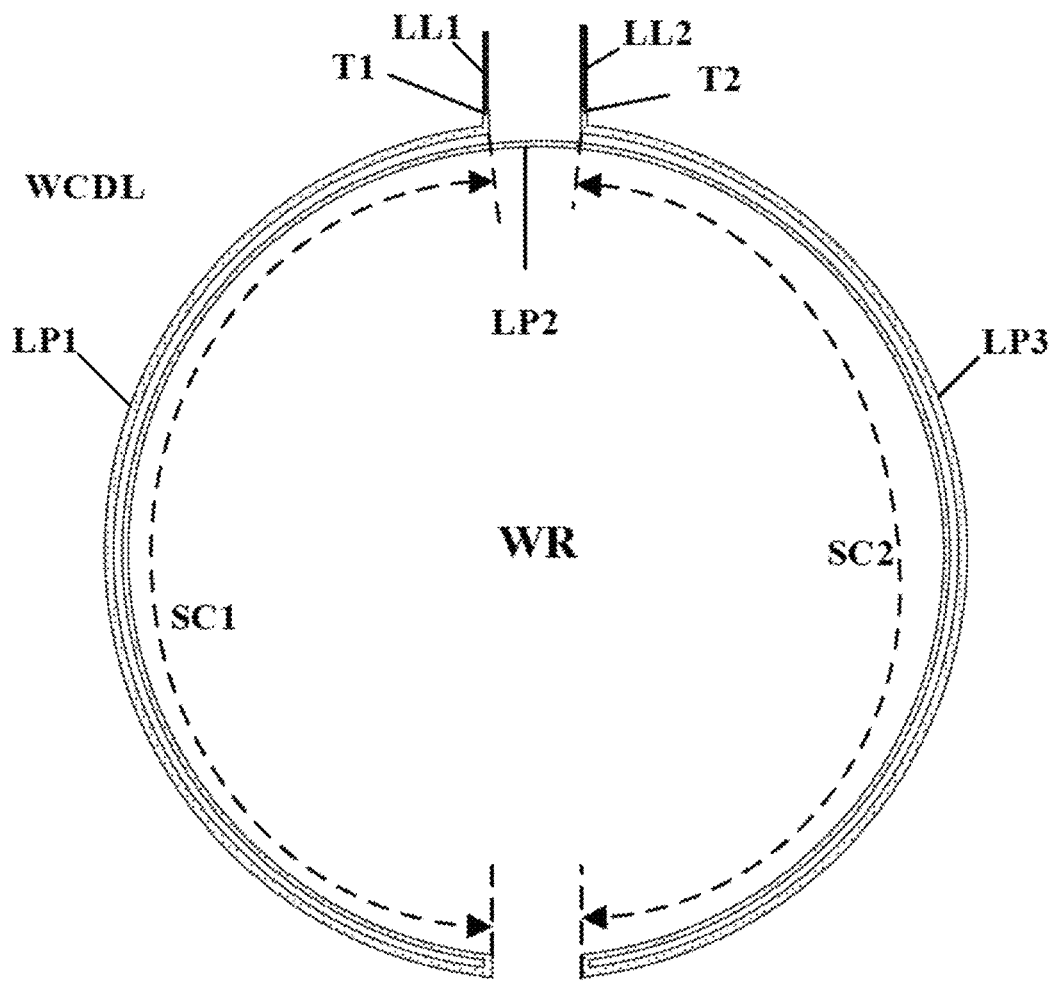
FIG. 5I is a schematic diagram illustrating the structure of a window region crack detection line in some embodiments according to the present disclosure.

FIG. 5I is a schematic diagram illustrating the structure of a window region crack detection line in some embodiments according to the present disclosure. In one example, referring to FIG. 5I, the window region crack detection line WCDL includes contiguously a first line portion LP1 extending counter-clock-wisely around a first section SC1 (e.g., a first half) of a periphery of the window region WR, a second line portion LP2 extending clock-wisely around the first section SC1 of the periphery of the window region and a second section SC2 (e.g., a second half) of the periphery of the window region WR, and a third line portion LP3 extending counter-clock-wisely around the second section SC2 of the periphery of the window region WR.

Figure 6:
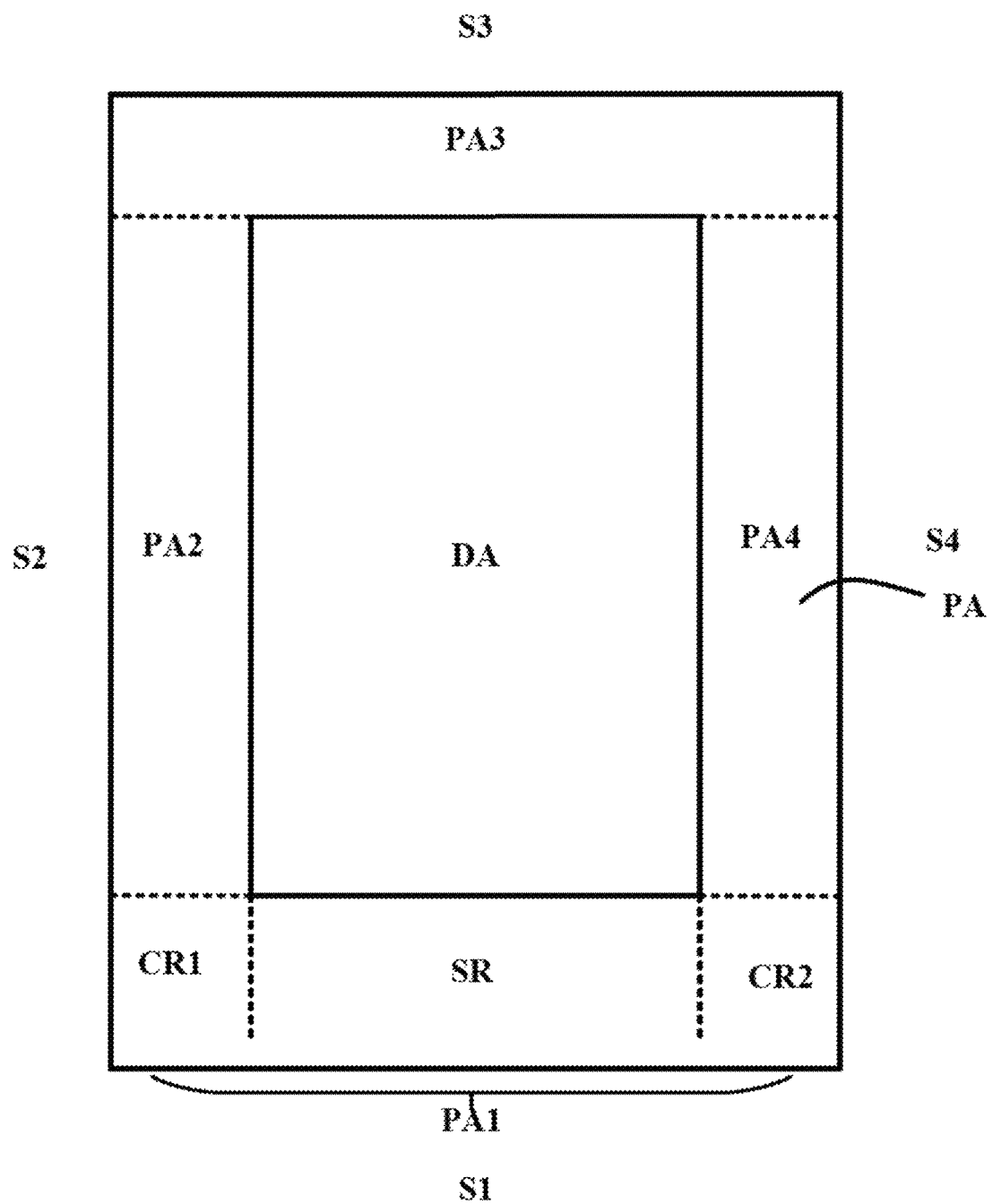
FIG. 6 is a schematic diagram illustrating a display area and a peripheral area in a display apparatus in some embodiments according to the present disclosure.

FIG. 6 is a schematic diagram illustrating a display area and a peripheral area in a display apparatus in some embodiments according to the present disclosure. Referring to FIG. 6, in some embodiments, the display apparatus includes a display area DA and a peripheral area PA. Optionally, the display area DA is substantially the same as the touch control area TCA in FIG. 4, and the peripheral area PA is substantially the same as the peripheral area PA in FIG. 4. In some embodiments, the peripheral area PA includes a first sub-area PA1 on a first side S1 of the display area DA, a second sub-area PA2 on a second side S2 of the display area DA, a third sub-area PA3 on a third side S3 of the display area DA, a fourth sub-area PA4 on a fourth side S4 of the display area DA. Optionally, the first side S1 and the third side S3 are opposite to each other. Optionally, the second side S2 and the fourth side S4 are opposite to each other. Optionally, the first sub-area PA1 is a sub-area where signal lines of the crack detection circuit (e.g., the first conduction loop) are connected to an integrated circuit.

In some embodiments, the first sub-area PA1 includes a side region SR and one or more corner regions (e.g., a first corner region CR1 and a second corner region CR2). The one or more corner regions are respectively at a corner of the display panel. The one or more corner regions respectively connect the side region SR to one or more adjacent sub-areas of the peripheral area PA. For example, the first corner region CR1 connects the side region SR to the second sub-area PA2, and the second corner region CR2 connects the side region SR to the fourth sub-area PA4.

Referring to FIG. 4, FIG. 5A, and FIG. 6, in some embodiments, the first touch crack detection line TCDL1 and the second touch crack detection line TCDL2 respectively extend from a first sub-area PA1 through a second sub-area PA2 into a third sub-area PA3 of a peripheral area PA of the display panel. More specifically, the first touch crack detection line TCDL1 extends from a first sub-area PA1, through a second sub-area PA2, into a third sub-area PA3 of a peripheral area PA of the display panel; the first touch crack detection line TCDL1 and the second touch crack detection line TCDL2 respectively connect to the window crack detection line WCDL; and the second touch crack detection line TCDL2 extends from the third sub-area PA3, through the second sub-area PA2, back into the first sub-area PA1.

In some embodiments, the first touch crack detection line TCDL1 and the second touch crack detection line TCDL2 are at least partially in a second layer. Referring to FIG. 3B and FIG. 3C, the second layer SL2 further includes mesh blocks of the touch electrode layer, e.g., mesh blocks of the plurality of first mesh electrodes TE1 and the plurality of second mesh electrodes TE2.

Figure 7A:
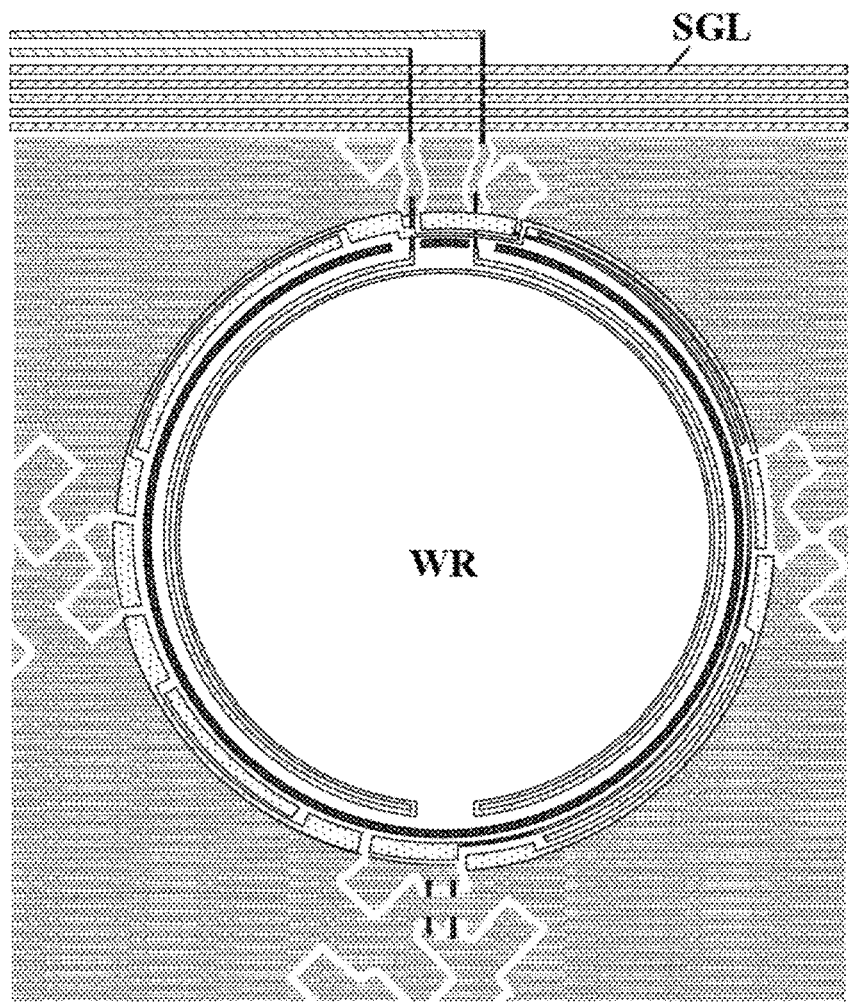
FIG. 7A is a detailed zoom-in view surrounding a window region of a display panel in some embodiments according to the present disclosure.
Figure 7B:
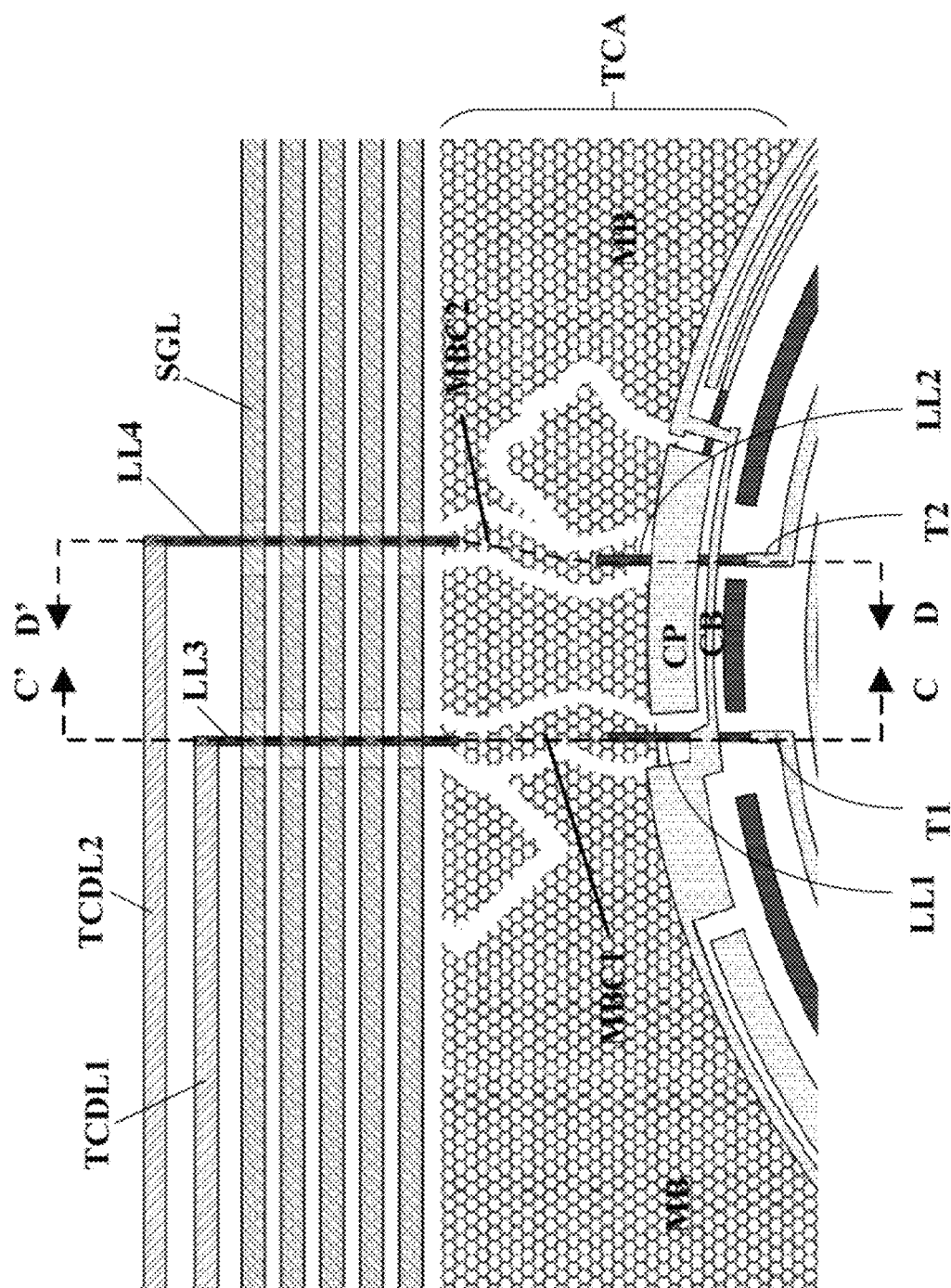
FIG. 7B is a further zoom-in view around a first connecting mesh block and a second connecting mesh block in some embodiments according to the present disclosure.

FIG. 7A is a detailed zoom-in view surrounding a window region of a display panel in some embodiments according to the present disclosure. FIG. 7B is a further zoom-in view around a first connecting mesh block and a second connecting mesh block in some embodiments according to the present disclosure. Referring to FIG. 4, FIG. 5A, FIG. 5B, FIG. 7A, and FIG. 7B, in some embodiments, the first conduction loop further comprises a first connecting mesh block MBC1 and a second connecting mesh block MBC2 respectively electrically connected to a first terminal T1 and a second terminal T2 of a window region crack detection line WCDL. The first connecting mesh block MBC1 and the second connecting mesh block MBC2 respectively extend through a portion of a touch control area TCA of the display panel, for example, from a location proximal to the window region WR to an edge of the touch control area TCA proximal to touch control signal lines SGL. The first connecting mesh block MBC1 and the second connecting mesh block MBC2 are respectively made of mesh lines, and are formed using a same material and patterned in a same process as the mesh blocks of the touch electrode layer, e.g., mesh blocks of the plurality of first mesh electrodes TE1 and the plurality of second mesh electrodes TE2.

In some embodiments, a contour of at least one of the first connecting mesh block MBC1 and the second connecting mesh block MBC2 has an undulating shape or a zig-zag shape. Optionally, each of the first connecting mesh block MBC1 and the second connecting mesh block MBC2 has an undulating shape or a zig-zag shape. In some embodiments, at least one of the first connecting mesh block MBC1 or the second connecting mesh block MBC2 is internal to a mesh block of the touch electrode layer or between adjacent mesh blocks of the touch electrode layer. Optionally, each of the first connecting mesh block MBC1 and the second connecting mesh block MBC2 is internal to a mesh block of the touch electrode layer or between adjacent mesh blocks of the touch electrode layer.

In some embodiments, the first connecting mesh block MBC1 and the second connecting mesh block MBC2 are in a second layer. Referring to FIG. 3B and FIG. 3C, the second layer SL2 further includes mesh blocks of the touch electrode layer, e.g., mesh blocks of the plurality of first mesh electrodes TE1 and the plurality of second mesh electrodes TE2. The first connecting mesh block MBC1 and the second connecting mesh block MBC2 are in a same layer as the mesh blocks of the plurality of first mesh electrodes TE1 and the plurality of second mesh electrodes TE2.

Referring to FIG. 5A, FIG. 5B, FIG. 7A, and FIG. 7B, in some embodiments, the first conduction loop CLP1 further includes first lead line LL1 connecting the first terminal T1 of the window region crack detection line WCDL to the first connecting mesh block MBC1 and a second lead line LL2 connecting the second terminal T2 of the window region crack detection line WCDL to the second connecting mesh block MBC2.

Figure 7C:
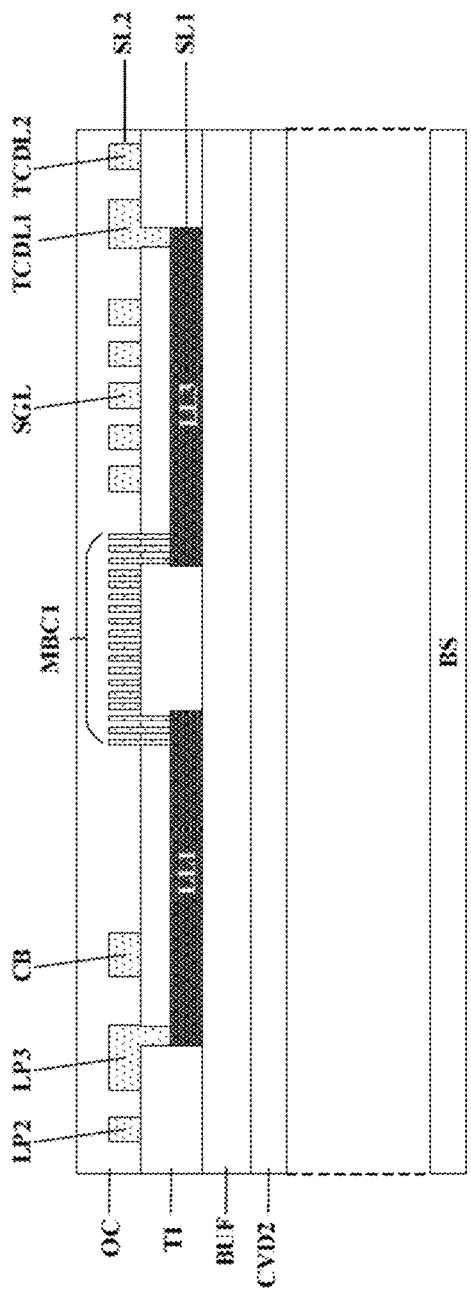
FIG. 7C is a cross-sectional view along a C-C' line in FIG. 7B.
Figure 7D:
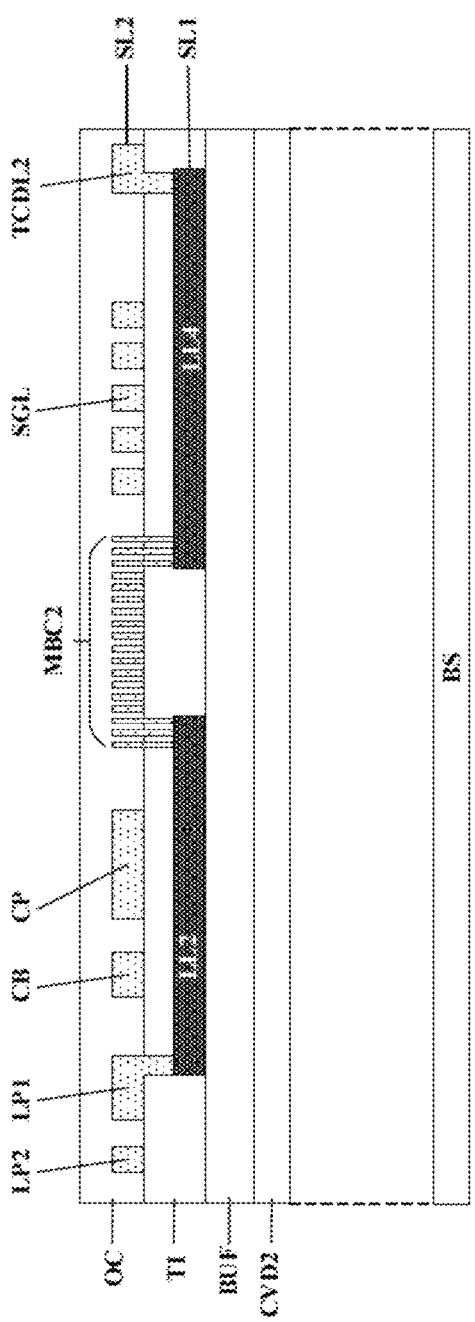
FIG. 7D is a cross-sectional view along a D-D' line in FIG. 7B.

In some embodiments, the first lead line and the second lead line are in a first layer spaced apart from the second layer by a touch insulating layer (e.g., the touch insulating layer TI in FIG. 3B and FIG. 3C). FIG. 7C is a cross-sectional view along a C-C' line in FIG. 7B. Referring to FIG. 7C, the first lead line LL1 connects to the first connecting mesh block MBC1 through a via extending through the touch insulating layer TI. FIG. 7D is a cross-sectional view along a D-D' line in FIG. 7B. Referring to FIG. 7D, the second lead line LL2 connects to the second connecting mesh block MBC2 through a via extending through the touch insulating layer TI. The first lead line LL1 and the second lead line LL2 are in a first layer SL1 spaced apart from the second layer SL2 by the touch insulating layer TI. The second layer SL2 in some embodiments includes the first line portion LP1, the second line portion LP2, the third line portion LP3, the first connecting mesh block MBC1, the second connecting mesh block MBC2, at least a sub-layer of a respective touch control signal line of touch control signal lines SGL, the first touch crack detection line TCDL1, and the second touch crack detection hue TCDL2.

Referring to FIG. 7A to FIG. 7D, the display panel in some embodiments further includes mesh blocks MB respectively around the window region WR, conductive plates CP respectively connected to the mesh blocks, and conductive bridges CB, wherein a respective conductive plate is directly connected to one or more mesh lines of a respective mesh block, and a respective conductive bridge connects two adjacent conductive plates. Referring to FIG. 7C and FIG. 7D, the first lead line LL1 and the second lead line LL2 respectively cross over at least one of a conductive plate or a conductive bridge. Specifically, the first lead line LL1 in one example crosses over a conductive bridge, and the second lead line LL2 in one example crosses over a conductive bridge and a conductive plate.

Referring to FIG. 7A to FIG. 7D, the first conduction loop in some embodiments further includes a third lead line LL3 connecting the first connecting mesh block MBC1 to a first touch crack detection line TCDL1 and a fourth lead line LL4 connecting the second connecting mesh block MBC2 to a second touch crack detection line TCDL2. Optionally, the first touch crack detection line TCDL1 and the second touch crack detection line TCDL2 are at least partially in the second layer SL2 and in a peripheral area of the display panel, the third lead line LL3 and the fourth lead line LL4 are in a first layer SL1 spaced apart from the second layer SL2 by the touch insulating layer TI. Referring to FIG. 7C, the third lead line LL3 connects to the first connecting mesh block MBC1 through a via extending through the touch insulating layer TI. Referring to FIG. 7D, the fourth lead line LL4 connects to the second connecting mesh block MBC2 through a via extending through the touch insulating layer TI.

Optionally, at least a portion of the first conduction loop CLP1 includes a first metal line in the first layer SL1 and a second metal line in the second layer SL2, the first metal line connected to the second metal line through a via extending through a touch insulating layer TI. Optionally, the first lead line LL1, the second lead line LL2, the third lead line LL3, and the fourth lead line LL4 are in the first layer SL1, e.g., in a same layer as the first metal line. Optionally, at least a portion of the first touch crack detection line TCDL1 is in the first layer SL1, e.g., in a same layer as the first metal line. Optionally, at least a portion of the second touch crack detection line TCDL2 is in the first layer SL1, e.g., in a same layer as the first metal line. Optionally, the first connecting mesh block MBC1 is in the first layer SL1, e.g., in a same layer as the first metal line. Optionally, the second connecting mesh block MBC2 is in the first layer SL1, e.g., in a same layer as the first metal line.

FIG. 5C is a schematic diagram illustrating the structure of a first touch crack sub-loop in some embodiments according to the present disclosure. Referring to FIG. 4, FIG. 5A, FIG. 5B, FIG. 5C, FIG. 6, and FIG. 7A to FIG. 7D, the first touch crack detection line TCDL1, the second touch crack detection line TCDL2, the window region crack detection line WCDL are parts of a first touch crack sub-loop TCSLP1. The first touch crack sub-loop TCSLP1 continuously extends from a first sub-area. PA1 of a peripheral area PA into an area substantially surrounding the window region WR, and then extends from the area substantially surrounding the window region WR back to the first sub-area PA1.

Specifically, the first touch crack sub-loop TCSLP1 continuously extends from the first sub-area PA1, sequentially to the second sub-area PA2, the third sub-area PA3, and into an area substantially surrounding the window region WR, and then continuously extends from the area substantially surrounding the window region WR, sequentially to, the third sub-area PA3, second sub-area PA2, and back to the first sub-area PA1.

Optionally, the first touch crack sub-loop TCSLP1 includes the first touch crack detection line TCDL1, the second touch crack detection line TCDL2, the window region crack detection line WCDL, the first lead line LL1, the second lead line LL2, the third lead line LL3, and the fourth lead line LL4.

In some embodiments, the first conduction loop CLP1 further includes a first panel crack sub-loop. FIG. 5D is a schematic diagram illustrating the structure of a first panel crack sub-loop in some embodiments according to the present disclosure. Referring to FIG. 4, FIG. 5A, and FIG. 5D, the first panel crack sub-loop PCSLP1 continuously extends from a first sub-area PA1 of a peripheral area PA into a third sub-area PA3 of the peripheral area PA of the display panel, and then extends from the third sub-area PA3 back to the first sub-area PA1. Specifically, the first panel crack sub-loop PCSLP1 continuously extends from the first sub-area PA1, through the second sub-area PA2, into the third sub-area PA3, and then extends from the third sub-area PA3, through the second sub-area PA2, back to the first sub-area PA1. Referring to FIG. 4, and FIG. 5A to FIG. 5D, a first terminal of the first panel crack sub-loop PCSLP1 is connected to the second touch crack detection line TCDL2; and a second terminal of the first panel crack sub-loop PCSLP1 is connected to the integrated circuit IC.

In some embodiments, the first touch crack detection line TCDL1 and the second touch crack detection line TCDL2 space apart the first conduction loop CLP1 and the display area DA. The first conduction loop CLP1 is on a side of the first touch crack detection line TCDL1 and the second touch crack detection line TCDL2 away from the display area DA. Optionally, the first conduction loop CLP1, the first touch crack detection line TCDL1, and the second touch crack detection line TCDL2 are on a same side relative to the display area DA.

In some embodiments, the first touch crack sub-loop TCSLP1 is configured to detect a crack in layers adjacent to the touch control structure, whereas the first panel crack sub-loop PCSLP1 is configured to detect a crack in a thin film transistor array substrate of the display panel. Optionally, the first panel crack sub-loop PCSLP1 is in a layer in a thin film transistor array substrate.

Referring to FIG. 1, in some embodiments, a respective one of the plurality of thin film transistors TFT includes a gate electrode G. The display panel further includes a first capacitor electrode Ce1 of a storage capacitor in a same layer as the gate electrode G; a first gate insulating layer GI1 on a side of the gate electrode G and the first capacitor electrode Ce1 away from the base substrate BS; a second capacitor electrode Ce2 of the storage capacitor on a side of the first gate insulating layer GI1 away from the base substrate BS; and a second gate insulating layer GI2 on a side of the second capacitor electrode Ce2 away from the base substrate BS. In one example, at least a portion of the first panel crack sub-loop PCSLP1 is in a same layer as the second capacitor electrode Ce2, and is between the first gate insulating layer GI1 and the second capacitor electrode Ce2.

In some embodiments, the first touch crack detection line TCDL1 and the second touch crack detection line TCDL2 are at least partially in a second layer. Referring to FIG. 3B and FIG. 3C, the second layer SL2 further includes mesh blocks of the touch electrode layer, e.g., mesh blocks of the plurality of first mesh electrodes TE1 and the plurality of second mesh electrodes TE2.

Referring to FIG. 4 and FIG. 5A, the crack detection circuit in some embodiments further includes a first connecting line CL1 connecting the first touch crack detection line TCDL1 to a source electrode of a switching transistor ST, a drain electrode of the switching transistor ST connected to a data line DL. When the integrated circuit IC provides a first voltage signal (e.g., a high voltage signal) to the first panel crack sub-loop PCSLP1, the first voltage signal transmits through the first panel crack sub-loop PCSLP1, the first touch crack sub-loop TCSLP1, through the first connecting line CL1, to the source electrode of the switching transistor ST. Optionally, the first connecting line CL1 is in a layer in a thin film transistor array substrate.

In a crack detection process, the first voltage signal is also provided to data lines other than the data line DL connected to the switching transistor ST. When the switching transistor ST is turned on, and when a line break is absent in the first conduction loop CLP1, the first voltage signal transmits to the data line DL and to the plurality of light emitting elements connected to the data line DL. In this state, the display panel displays a dark image throughout the display area. When the switching transistor ST is turned on, and when a line break is present in the first conduction loop CLP1, the first voltage signal is not transmitted to the plurality of light emitting elements connected to the data line DL. In this state, the first voltage signal is transmitted to light emitting elements connected to the data lines other than the data line DL, and the display panel displays a bright line corresponding to the data line DL, among a dark image in other areas. The bright line indicates there is a line break in the first conduction loop CLP1, which indicates a crack is present in the display panel. The crack may be present in the thin film transistor array substrate, or in the layers adjacent to the touch control structure, or somewhere adjacent to the window region.

Figure 8A:
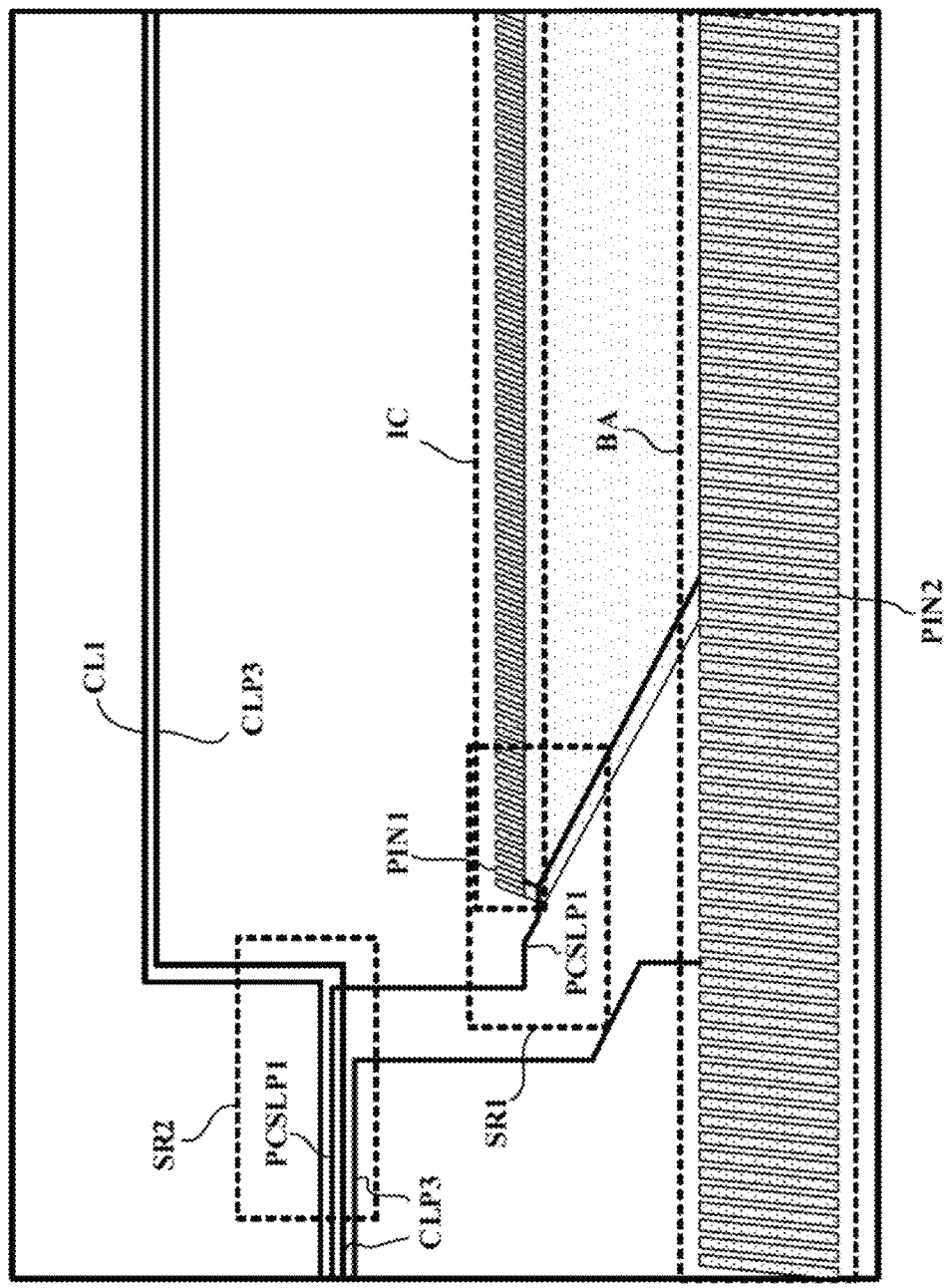
FIG. 8A is diagram illustrating an arrangement of detection lines in a first region R1 in FIG. 4.
Figure 8B:
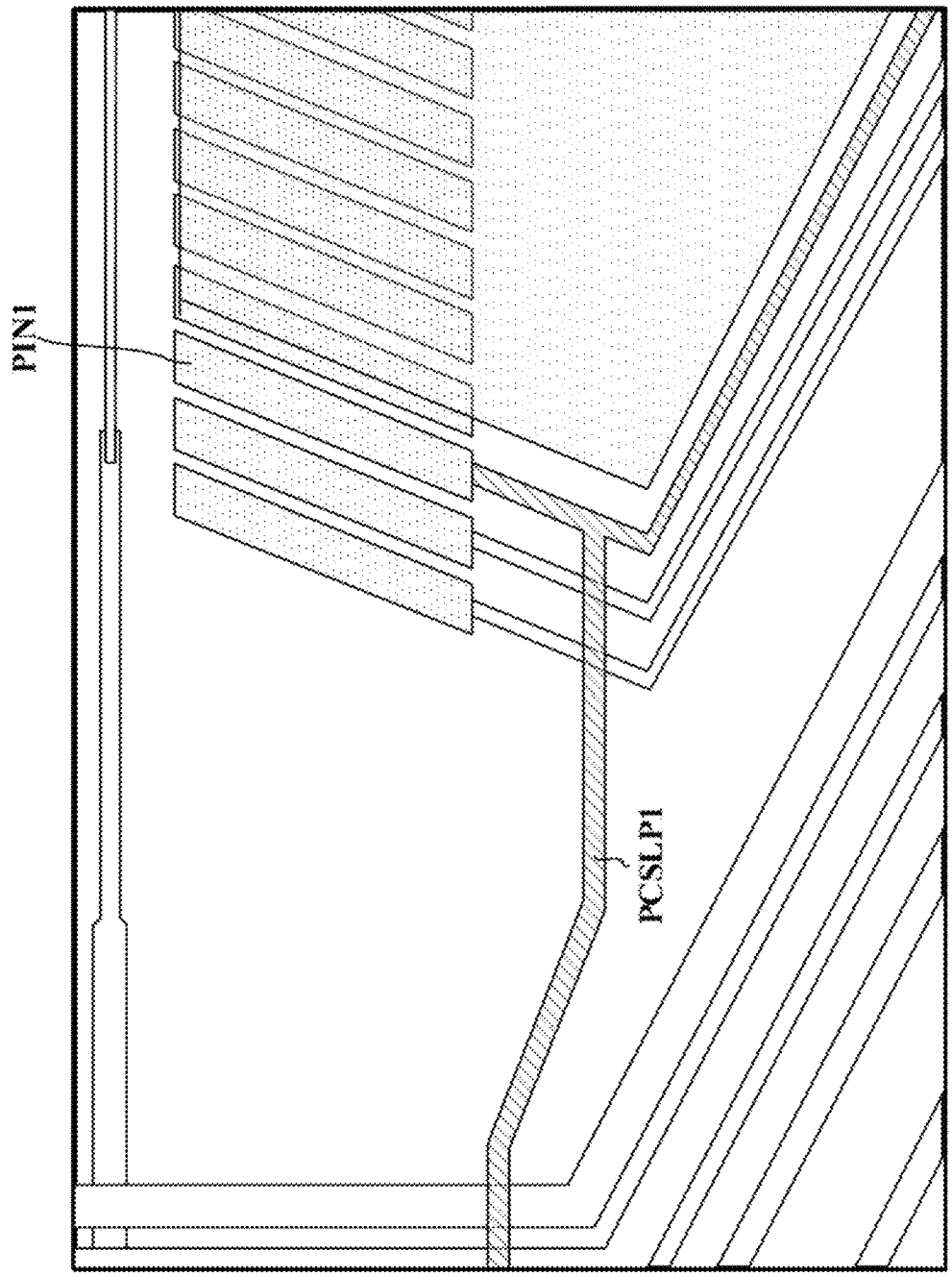
FIG. 8B is a further zoom-in view of a first sub-region SR1 in FIG. 8A.
Figure 8C:
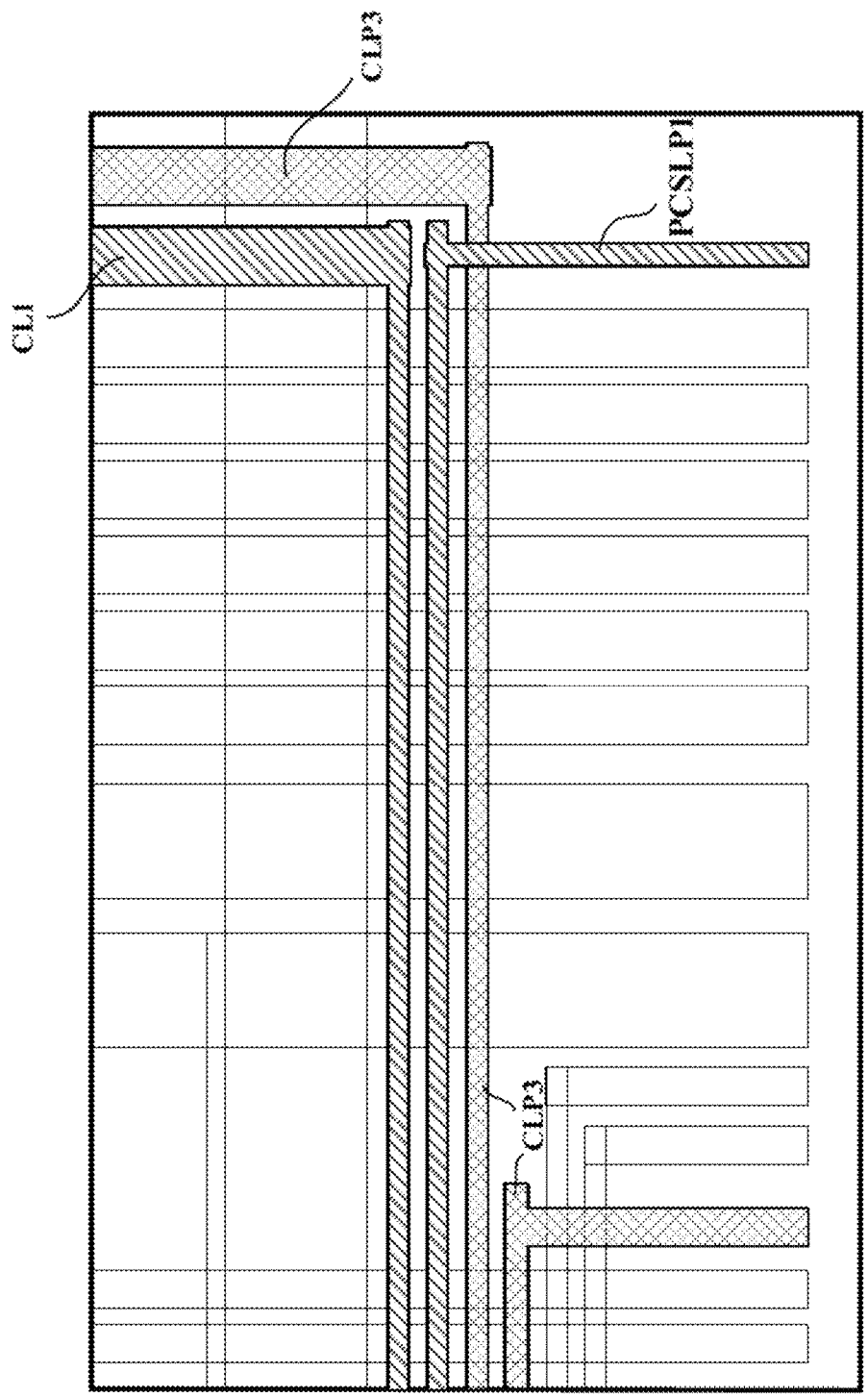
FIG. 8C is a further zoom-in view of a second sub-region SR2 in FIG. 8A.

FIG. 8A is diagram illustrating an arrangement of detection lines in a first region R1 in FIG. 4. Referring to FIG. 8A, the display panel in some embodiments includes a bonding area BA for bonding a flexible printed circuit. Referring to FIG. 8A, the second terminal of the first panel crack sub-loop PCSLP1 is connected to a first pin PIN1 in the integrated circuit IC, which is in turn connected to a second pin PIN2 in the bonding area BA for bonding a flexible printed circuit. When a flexible printed circuit is connected to the display panel, the first panel crack sub-loop PCSLP1 is connected to the flexible printed circuit through the second pin PIN2. FIG. 8B is a further zoom-in view of a first sub-region SR1 in FIG. 8A. FIG. 8C is a further zoom-in view of a second sub-region SR2 in FIG. 8A.

Referring to FIG. 4, in some embodiments, the crack detection circuit further includes a second conduction loop CLP2 electrically connected to the integrated circuit IC. FIG. 5E is a diagram illustrating the structure of a second conduction loop in some embodiments according to the present disclosure. Referring to FIG. 4 and FIG. 5E, the second conduction loop CLP2 includes a third touch crack detection line TCDL3 and a fourth touch crack detection line TCDL4. FIG. 5F is a schematic diagram illustrating the structure of a second touch crack sub-loop in some embodiments according to the present disclosure. Referring to FIG. 4, FIG. 5E, FIG. 5F, and FIG. 6, the third touch crack detection line TCDL3 and the fourth touch crack detection line TCDL4 are connected to each other in the third sub-area PA3. Referring to FIG. 4, FIG. 5F, FIG. 5F, FIG. 6, and FIG. 7A to FIG. 7D, the third touch crack detection line TCDL3 and the fourth touch crack detection line TCDL4 are parts of a second touch crack sub-loop TCSLP2. The second touch crack sub-loop TCSLP2 continuously extends from the first sub-area PA1 into the third sub-area PA3, and then extends from the third sub-area PA3 back to the first sub-area PA1. The third touch crack detection line TCDL3 and the fourth touch crack detection line TCDL4 are on a same side relative to the display area DA. In one example, the third touch crack detection line TCDL3 spaces apart the fourth touch crack detection line TCDL4 and the display area DA.

Referring to FIG. 4, FIG. 5E, FIG. 5F, and FIG. 6, in some embodiments, the third touch crack detection line TCDL3 and the fourth touch crack detection line TCDL4 respectively extend from a first sub-area PA1 through a fourth sub-area PA4 into a third sub-area PA3 of a peripheral area PA of the display panel. More specifically, the third touch crack detection line TCDL3 extends from a first sub-area PA1, through a fourth sub-area PA4, into a third sub-area PA3 of a peripheral area PA of the display panel; the third touch crack detection line TCDL3 directly connects to the fourth touch crack detection line TCDL4 in the third sub-area PA3; and the fourth touch crack detection line TCDL4 extends from the third sub-area PA3, through the fourth sub-area PA4, back into the first sub-area PA1.

In some embodiments, the first conduction loop CLP1 and the second conduction loop CLP2 are spaced apart from each other, at least a portion of the first conduction loop CLP1 and at least a portion of the second conduction loop CLP2 are on opposite sides relative to the display area DA. Optionally, another portion of the first conduction loop CLP1 and another portion of the second conduction loop CLP2 are on a same side relative to the display area DA.

Optionally, at least a portion of the first conduction loop CLP1 includes a first metal line in a first layer and a second metal line in a second layer, the first metal line connected to the second metal line through a first via extending through a touch insulating layer; and at least a portion of the second conduction loop CLP2 includes a third metal line in the first layer and a fourth metal line in the second layer, the third metal line connected to the fourth metal line through a second via extending through a touch insulating layer. Optionally, at least a portion of the third touch crack detection line TCDL3 is in the first layer SL1, e.g., in a same layer as the first metal line. Optionally, at least a portion of the fourth touch crack detection line TCDL4 is in the first layer SL1, e.g., in a same layer as the first metal line. Optionally, at least a portion of the window region crack detection line WCDL (e.g., the first line portion LP1, the second line portion LP2, or the third line portion LP3) includes a fifth metal line in the first layer and a sixth metal line in the second layer.

In some embodiments, the third touch crack detection line TCDL3 and the fourth touch crack detection line TCDL4 are at least partially in a second layer. Referring to FIG. 3B and FIG. 3C, the second layer SL2 further includes mesh blocks of the touch electrode layer, e.g., mesh blocks of the plurality of first mesh electrodes TE1 and the plurality of second mesh electrodes TE2.

In some embodiments, the second conduction loop CLP2 further includes a second panel crack sub-loop. FIG. 5G is a schematic diagram illustrating the structure of a second panel crack sub-loop in some embodiments according to the present disclosure. Referring to FIG. 4, FIG. 5E, and FIG. 5G, the second panel crack sub-loop PCSLP2 continuously extends from a first sub-area PA1 of a peripheral area PA into a third sub-area PA3 of the peripheral area PA of the display panel, and then extends from the third sub-area PA3 back to the first sub-area PA1. Specifically, the second panel crack sub-loop PCSLP2 continuously extends from the first sub-area PA1, through the fourth sub-area PA4, into the third sub-area PA3, and then extends from the third sub-area PA3, through the fourth sub-area PA4, back to the first sub-area PA1. Referring to FIG. 4, and FIG. 5E to FIG. 5G, a first terminal of the second panel crack sub-loop PCSLP2 is connected to the fourth touch crack detection line TCDL4; and a second terminal of the second panel crack sub-loop PCSLP2 is connected to the integrated circuit IC.

In some embodiments, the third touch crack detection line TCDL3 and the fourth touch crack detection line TCDL4 space apart the second panel crack sub-loop PCSLP2 and the display area DA. The second conduction loop CLP2 is on a side of the third touch crack detection line TCDL3 and the fourth touch crack detection line TCDL4 away from the display area DA. Optionally, the second conduction loop CLP2, the third touch crack detection line TCDL3, and the fourth touch crack detection line TCDL4 are on a same side relative to the display area DA.

In some embodiments, the first touch crack sub-loop TCSLP1 is configured to detect a crack in layers adjacent to the touch control structure, e.g., on the left side of the display panel, the second touch crack sub-loop TCSLP2 is configured to detect a crack in layers adjacent to the touch control structure, e.g., on the right side of the display panel, whereas the first panel crack sub-loop PCSLP1 is configured to detect a crack in a thin film transistor array substrate of the display panel, e.g., on the left side of the display panel, and the second panel crack sub-loop PCSLP2 is configured to detect a crack in a thin film transistor array substrate of the display panel, on the right side of the display panel. Optionally, the first panel crack sub-loop PCSLP1 is in a layer in a thin film transistor array substrate, and the second panel crack sub-loop PCSLP2 is in a layer in a thin film transistor array substrate.

In some embodiments, the third touch crack detection line TCDL3 and the fourth touch crack detection line TCDL4 are at least partially in a second layer. Referring to FIG. 3B and FIG. 3C, the second layer SL2 further includes mesh blocks of the touch electrode layer, e.g., mesh blocks of the plurality first mesh electrodes TE1 and the plurality of second mesh electrodes TE2.

Referring to FIG. 4 and FIG. 5E, the crack detection circuit in some embodiments further includes a second connecting line CL2 connecting the third touch crack detection line TCDL3 to a source electrode of a switching transistor ST, a drain electrode of the switching transistor ST connected to a data line DL. When the integrated circuit IC provides a first voltage signal (e.g., a high voltage signal) to the second panel crack sub-loop PCSLP2, the first voltage signal transmits through the second panel crack sub-loop PCSLP2, the second touch crack sub-loop TCSLP2, through the second connecting line CL2, to the source electrode of the switching transistor ST. Optionally, the second connecting line CL2 is in a layer in a thin film transistor array substrate.

In a crack detection process, the first voltage signal is also provided to data lines other than the data line DL connected to the switching transistor ST. When the switching transistor ST is turned on, and when a line break is absent in the second conduction loop CLP2, the first voltage signal transmits to the data line DL and to the plurality of light emitting elements connected to the data line DL. In this state, the display panel displays a dark image throughout the display area. When the switching transistor ST is turned on, and when a line break is present in the second conduction loop CLP2, the first voltage signal is not transmitted to the plurality of light emitting elements connected to the data line DL. In this state, the first voltage signal is transmitted to light emitting elements connected to the data lines other than the data line DL, and the display panel displays a bright line corresponding to the data line DL, among a dark image in other areas. The bright line indicates there is a line break in the second conduction loop CLP2, which indicates a crack is present in the display panel, e.g., on the right side of the display panel. The crack may be present in the thin film transistor array substrate, or in the layers adjacent to the touch control structure.

Figure 9:
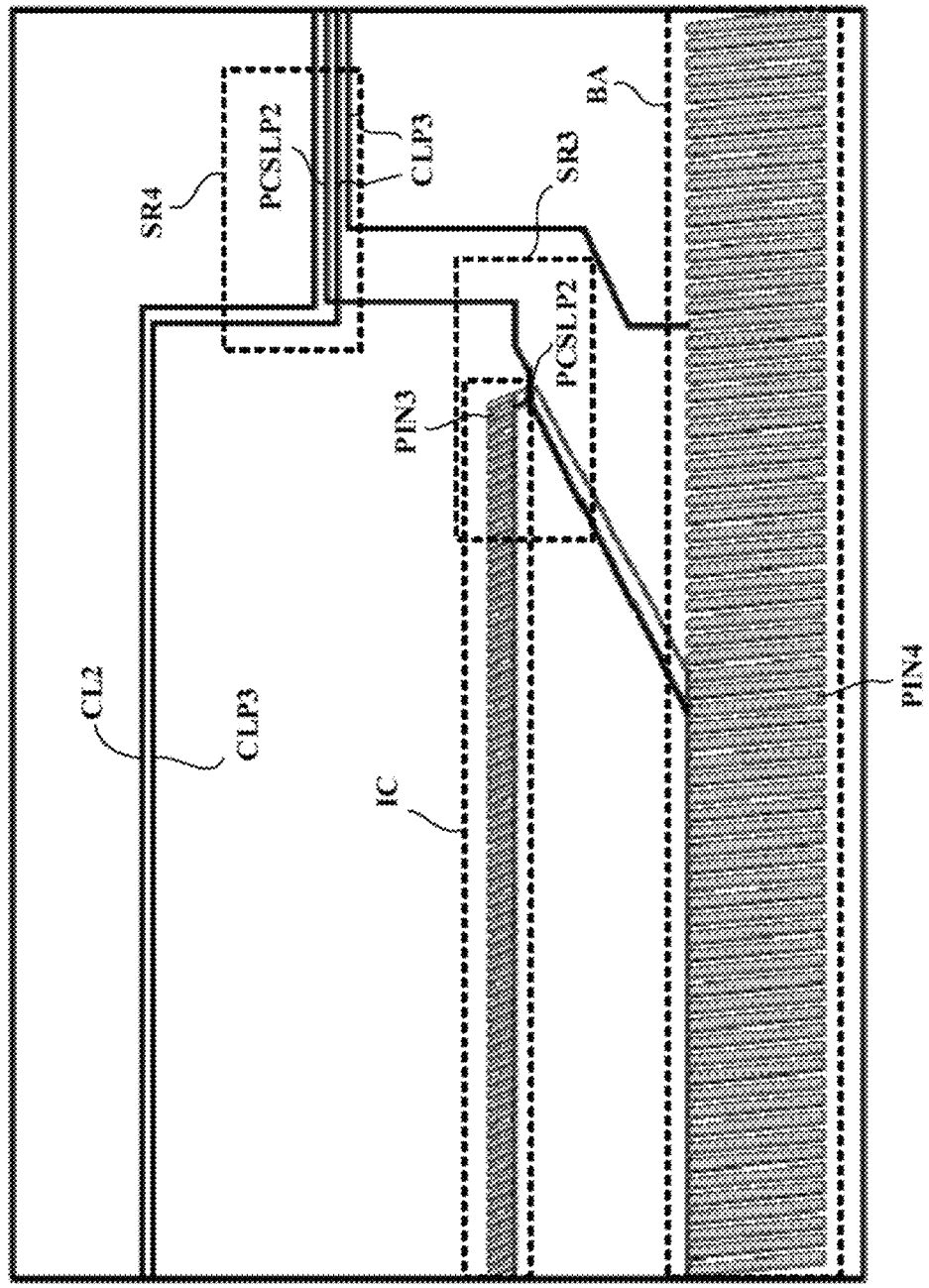
FIG. 9 is diagram illustrating an arrangement of detection lines in a second region R2 in FIG. 4.

FIG. 9 is diagram illustrating an arrangement of detection lines in a first region R1 in FIG. 4. Referring to FIG. 9, the display panel in some embodiments includes a bonding area BA for bonding a flexible printed circuit. Referring to FIG. 9, the second terminal of the second panel crack sub-loop PCSLP2 is connected to a third pin PIN3 in the integrated circuit IC, which is in turn connected to a fourth pin PIN4 in the bonding area BA for bonding a flexible printed circuit. When a flexible printed circuit is connected to the display panel, the second panel crack sub-loop PCSLP2 is connected to the flexible printed circuit through the fourth pin PIN4.

Referring to FIG. 4, the crack detection circuit in some embodiments further includes a third conduction loop CLP3. The third conduction loop CLP3 is configured to detect a crack in the display panel by measuring a resistance of the third conduction loop CLP3. A measured value of a resistance of the third conduction loop CLP3 that is greater than a reference value indicates the presence of a line break in the third conduction loop CLP3, which in turn indicates the presence of a crack in the display panel. In one example, the third conduction loop CLP3 is disposed in the thin film transistor array substrate, and the third conduction loop CLP3 is configured to detect a crack in the thin film transistor array substrate. In another example, the third conduction loop CLP3 is disposed in a layer adjacent to the touch control structure, and the third conduction loop CLP3 is configured to detect a crack in layers adjacent to the touch control structure.

In some embodiments, the first conduction loop CLP1 and the second conduction loop CLP2 space apart the third conduction loop CLP3 from the display area DA. Optionally, a first portion of the third conduction loop CLP3 is on a side of the first conduction loop CLP1 away from the display area DA, and a second portion of the third conduction loop CLP3 is on a side of the second conduction loop CLP2 away from the display area DA.

FIG. 5H is a schematic diagram illustrating the structure of a third conduction loop in some embodiments according to the present disclosure. Referring to FIG. 4, FIG. 5H, and FIG. 6, in some embodiments, the third conduction loop CLP3 continuously extends, sequentially, from a first corner region CR1 of a first sub-area PA1, to a second sub-area PA2, to a third sub-area PA3, to the second sub-area PA2, to the first sub-area PA1, to a fourth sub-area PA4, to the third sub-area PA3, to the fourth sub-area PA4, and back to a second corner region CR2 of the first sub-area PA1. The first sub-area PA1, the second sub-area PA2, the third sub-area PA3, and the fourth sub-area PA4 are respectively sub-areas of a peripheral area PA in the display panel. In one example, as shown in FIG. 4 and FIG. 5H, a first terminal and a second terminal of the third conduction loop CLP3 are respectively connected to two bonding pins (e.g., a fifth pin PIN5 and a sixth pin PIN6) in a bonding area BA for bonding a flexible printed circuit. In a display apparatus having a flexible printed circuit bonded on the bonding area BA, the terminals of the third conduction loop CLP3 are connected to the flexible printed circuit.

Figure 10A:
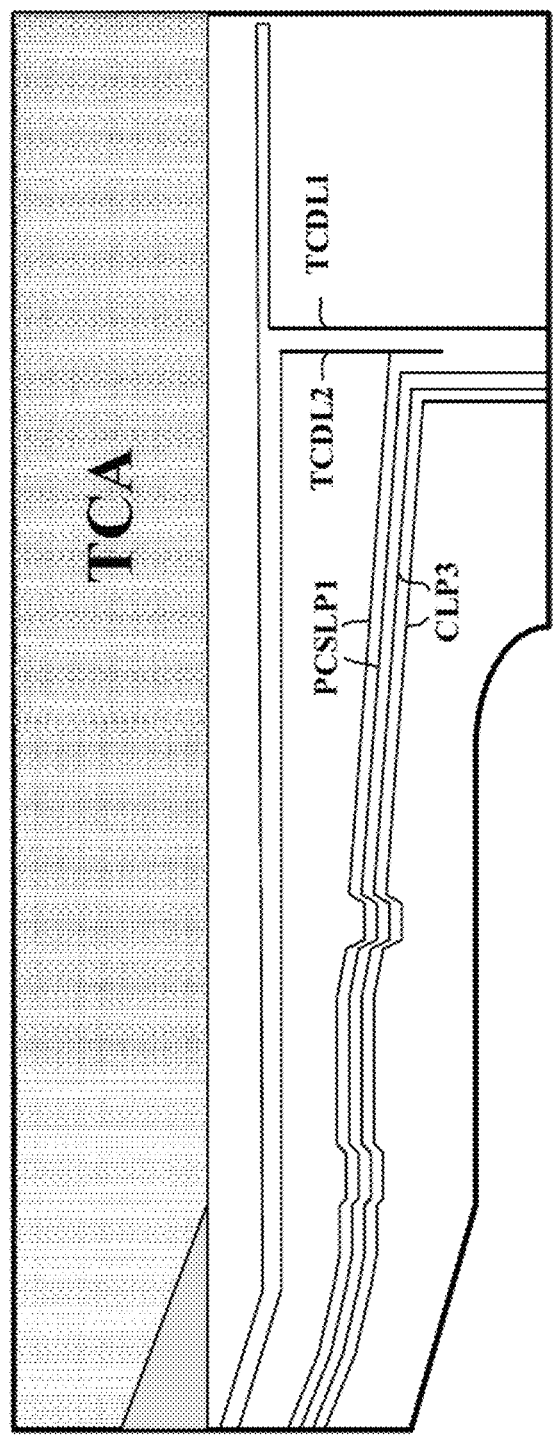
FIG. 10A is diagram illustrating an arrangement of detection lines in a third region R3 in FIG. 4.
Figure 10B:
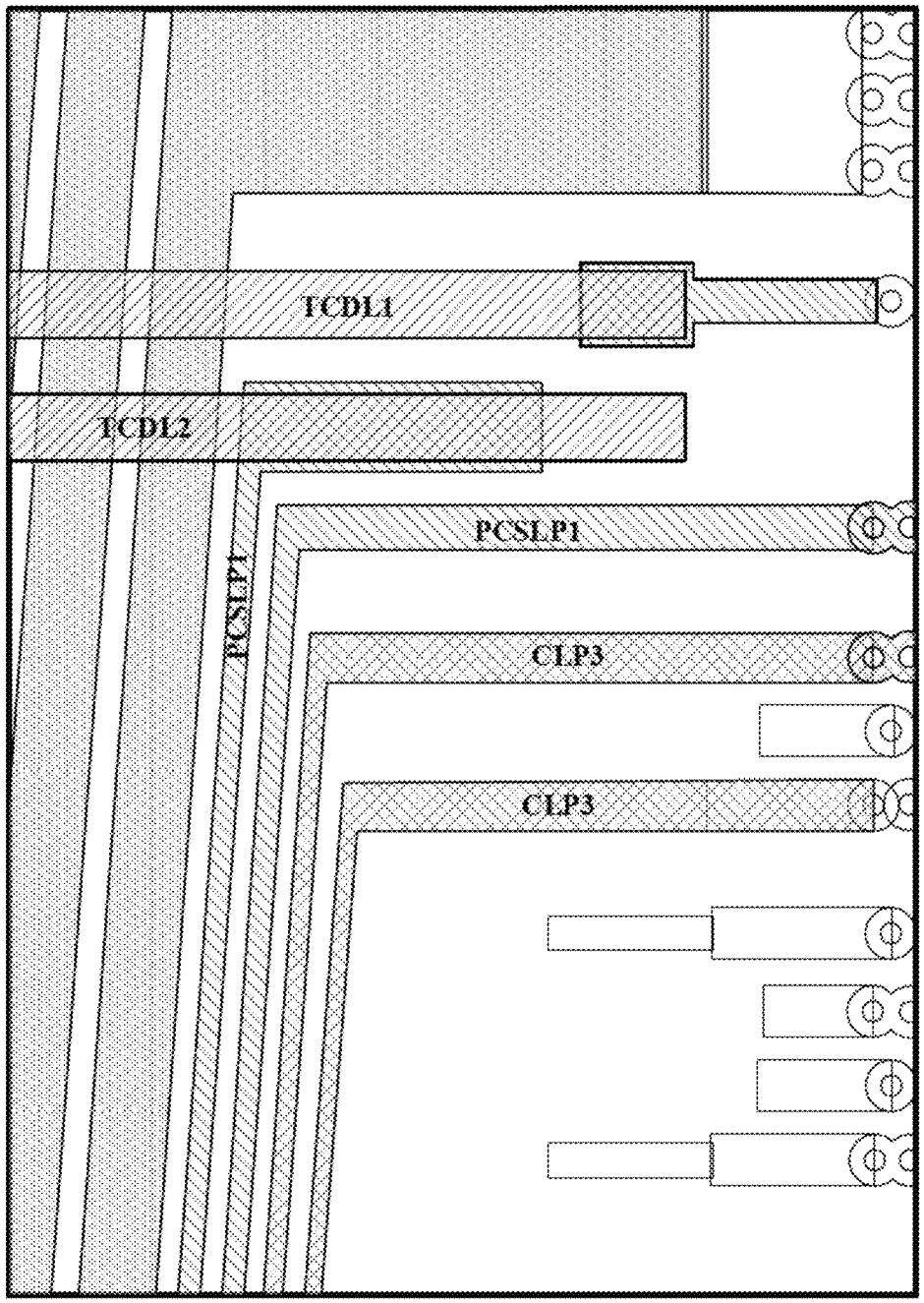
FIG. 10B is a further zoom-in view of a third sub-region SR3 in FIG. 10A.

FIG. 10A is diagram illustrating an arrangement of detection lines in a third region R3 in FIG. 4. FIG. 10B is a further zoom-in view of a third sub-region SR3 in FIG. 10A. FIG. 10A and FIG. 10B illustrate connectivity between the second touch crack detection line TCDL2 and the first panel crack sub-loop PCSLP1 in one example, and the arrangement of the detection lines in this region.

Figure 11:
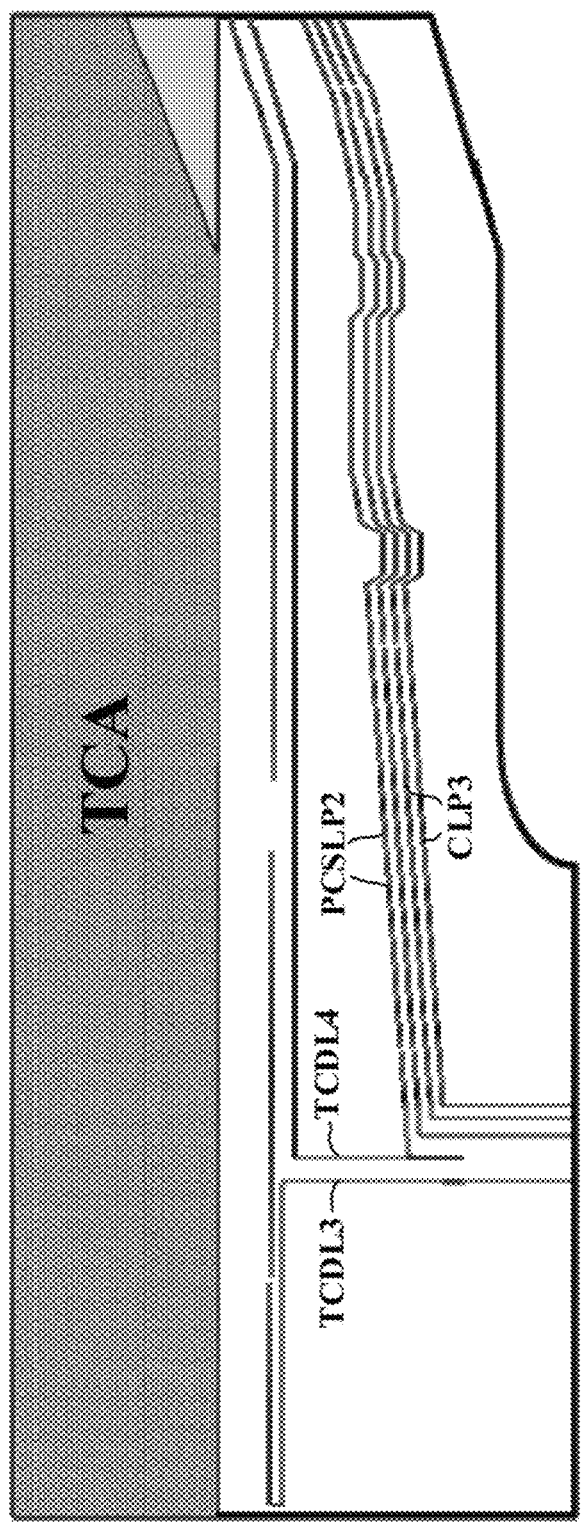
FIG. 11 is diagram illustrating an arrangement of detection lines in a fourth region R4 in FIG. 4.

FIG. 11 is diagram illustrating an arrangement of detection lines in a fourth region R4 in FIG. 4. FIG. 11 illustrates connectivity between the fourth touch crack detection line TCDL4 and the second panel crack sub-loop PCSLP2 in one example, and the arrangement of the detection lines in this region.

Figure 12:
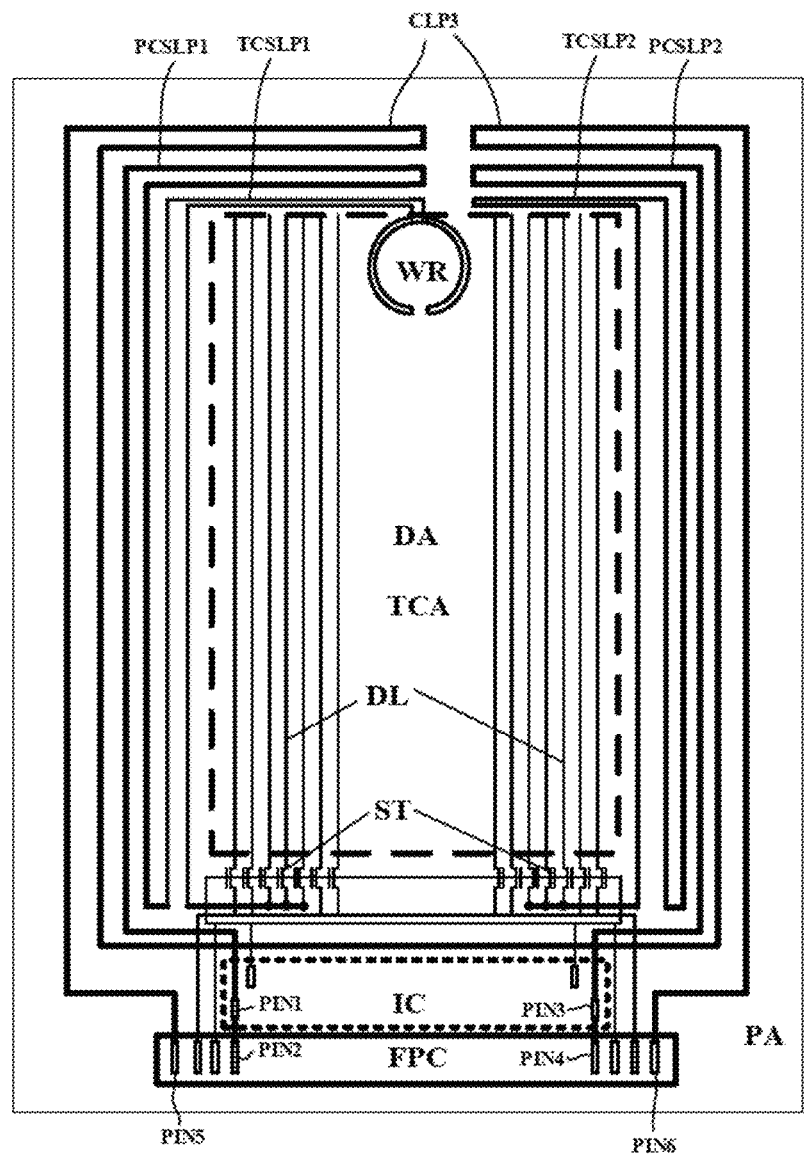
FIG. 12 is a diagram illustrating the structure of a display apparatus in some embodiments according to the present disclosure.

In another aspect, the present disclosure provides a display apparatus. FIG. 12 is a diagram illustrating the structure of a display apparatus in some embodiments according to the present disclosure. Referring to FIG. 12, in some embodiments, the display apparatus includes a display panel described herein; and a flexible printed circuit FPC connected to the integrated circuit IC. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In some embodiments, a first terminal and a second terminal of the third conduction loop CLP3 are respectively connected to two bonding pins (e.g., PIN5 and PIN6) bonded to the flexible printed circuit. In some embodiments, a second terminal of the first panel crack sub-loop PCSLP1 is connected to a first pin PIN1 in the integrated circuit IC, which is in turn connected to a second pin PIN2, the second pin PIN2 bonded to the flexible printed circuit FPC.

In some embodiments, a second terminal of the second panel crack sub-loop PCSLP2 is connected to a third pin PIN3 in the integrated circuit IC, which is in turn connected to a fourth pin PIN4, the fourth pin PIN4 bonded to the flexible printed circuit FPC.

In another aspect, the present disclosure further provides a method of detecting crack in a display panel. In some embodiments, the display panel includes display elements in a display area; a touch electrode layer at least partially in the display area. The display elements and the touch electrode layer are absent in a window region that is at least partially surrounded by the display area. In some embodiments, the method includes providing a first conduction loop; electrically connecting a first terminal of the first conduction loop to an integrated circuit; electrically connecting a second terminal of the first conduction loop to a source electrode of a switching transistor; electrically connecting a drain electrode of the switching transistor to a data line; providing, by the integrated circuit, a voltage signal to the first terminal of the first conduction loop while turning on the switching transistor; and determining presence or absence of a crack in a region having the first conduction loop based on light emitting status of light emitting elements connected to the data line. Optionally, providing the first conduction loop comprises extending a window region crack detection line of the first conduction loop into a region substantially surrounding the window region; and determining presence or absence of the crack comprises determining presence or absence of a crack in the region substantially surrounding the window region.

In some embodiments, providing the first conduction loop further includes extending a first touch crack detection line of the first conduction loop from a first sub-area through a second sub-area into a third sub-area of a peripheral area of the display panel, and extending a second touch crack detection line of the first conduction loop from the third sub-area through the second sub-area into the first sub-area; and determining presence or absence of the crack further comprises determining presence or absence of a crack in a touch control structure in the first sub-area, the second sub-area, and the third sub-area.

In some embodiments, providing the first conduction loop further includes extending a first panel crack sub-loop of the first conduction loop from a first sub-area of a peripheral area through a second sub-area into a third sub-area of a peripheral area of the display panel and back to the first sub-area; and determining presence or absence of the crack further comprises determining presence or absence of a crack in a thin film transistor array substrate in the first sub-area, the second sub-area, and the third sub-area.

In some embodiments, the method further includes providing a second conduction loop; electrically connecting a first terminal of the second conduction loop to an integrated circuit; electrically connecting a second terminal of the second conduction loop to a source electrode of a switching transistor; electrically connecting a drain electrode of the switching transistor to a data line; providing, by the integrated circuit, a voltage signal to the first terminal of the second conduction loop while turning on the switching transistor; and determining presence or absence of a crack in a region having the second conduction loop based on light emitting status of light emitting elements connected to the data line. Optionally, providing the second conduction loop comprises extending a third touch crack detection line of the second conduction loop from a first sub-area through a fourth sub-area into a third sub-area of a peripheral area of the display panel, and extending a second touch crack detection line of the second conduction loop from the third sub-area through the fourth sub-area into the first sub-area; and determining presence or absence of the crack further comprises determining presence or absence of a crack in a touch control structure in the first sub-area, the fourth sub-area, and the third sub-area.

In some embodiments, providing the second conduction loop further includes extending a second panel crack sub-loop of the second conduction loop from a first sub-area of a peripheral area through a fourth sub-area into a third sub-area of a peripheral area of the display panel and back to the first sub-area; and determining presence or absence of the crack further comprises determining presence or absence of a crack in a thin film transistor array substrate in the first sub-area, the fourth sub-area, and the third sub-area.

In some embodiments, the method further includes providing a third conduction loop continuously extending, sequentially, from a first corner region of a first sub-area, to a second sub-area, to a third sub-area, to the second sub-area, to the first sub-area, to a fourth sub-area, to the third sub-area, to the fourth sub-area, and back to a second corner region of the first sub-area. Optionally, the first sub-area, the second sub-area, the third sub-area, and the fourth sub-area are respectively sub-areas of a peripheral area in the display panel; and determining presence or absence of the crack further comprises measuring a resistance of the third conduction loop.

In some embodiments, the method further includes respectively connecting a first terminal and a second terminal of the third conduction loop to two bonding pins that are bonded to a flexible printed circuit.

In another aspect, the present disclosure provides a touch control structure. In some embodiments, the touch control structure includes a plurality of first mesh electrodes along a row direction and a plurality of second mesh electrodes along a column direction. In some embodiments, the touch control structure is limited in a touch control area and absent in a window region surrounded by the touch control area. Optionally, a window-crossing column of the plurality of second mesh electrodes includes a first mesh block and a second mesh block respectively on a first side and a second side of the window region; a first conductive plate directly connected to one or more mesh lines of the first mesh block; a second conductive plate directly connected to one or more mesh lines of the second mesh block; and a first conductive bridge connecting the first conductive plate and the second conductive plate. Optionally, the first conductive bridge comprises a first segment and a second segment; and the second segment is in a layer different from the first segment, the first conductive plate, and the second conductive plate. The column direction and the row direction cross over each other. Optionally, the column direction and the row direction are perpendicular to each other. Optionally, the column direction and the row direction cross over each other at an inclined angle that is not 90 degrees.

Mesh electrodes include mesh lines which typically have a line width in a range of 1 μm to 50 μm. Thus, connecting adjacent mesh blocks through the mesh lines is particularly difficult, and often resulting in poor connectivity. The present disclosure adopts a novel and advantageous touch electrode design that obviate issues in related touch control structures.

Figure 13:
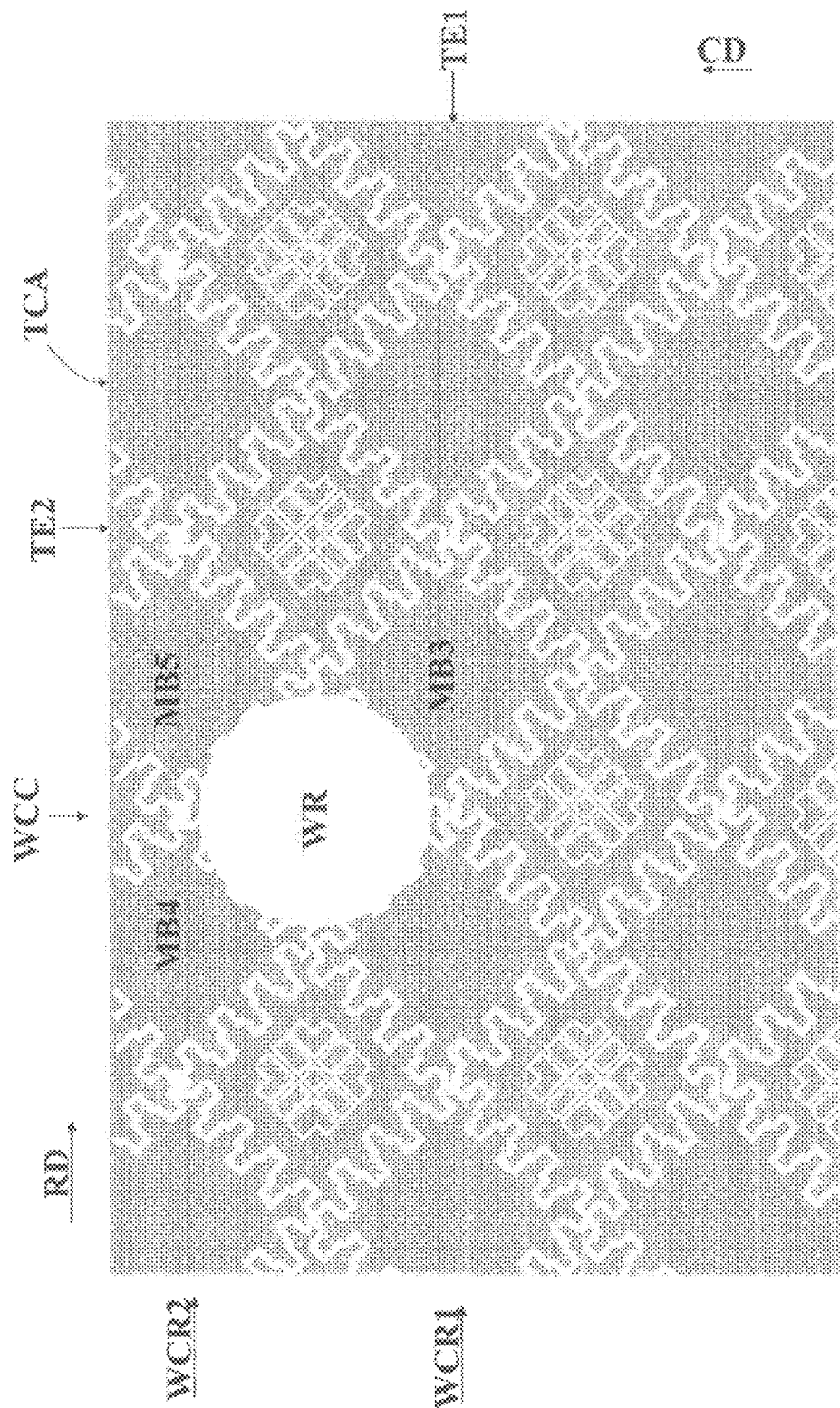
FIG. 13 is a schematic diagram illustrating the structure of a touch control structure in some embodiments according to the present disclosure.

FIG. 13 is a schematic diagram illustrating the structure of a touch control structure in some embodiments according to the present disclosure. Referring to FIG. 13, the touch control structure in some embodiments includes a plurality of first mesh electrodes TE1 arranged respectively in a plurality of rows and a plurality of second mesh electrodes TE2 arranged in respectively a plurality of columns. Adjacent rows of the plurality of rows are isolated from each other. Adjacent columns of the plurality of columns are isolated from each other. Optionally, the touch control structure is a mutual capacitance type touch control structure. Optionally, the plurality of first mesh electrodes TE1 are a plurality of touch scanning electrodes, and the plurality of second mesh electrodes TE2 are a plurality of touch sensing electrodes. Optionally, the plurality of mesh touch electrodes TE1 are a plurality of touch sensing electrodes, and the plurality of second mesh electrodes TE2 are a plurality of touch scanning electrodes. Optionally, the touch control structure is in a touch control area of a display panel. Optionally, the touch control area substantially overlaps with a display area of the display panel. The display panel is configured to display an image in at least a portion of the touch control area.

In some embodiments, the respective one of the plurality of first mesh electrodes TE1 extends along a row direction RD; and the respective one of the plurality of second mesh electrodes TE2 extends along a column direction CD. Optionally, the row direction RD and the column direction CD are two non-parallel directions, for example, the row direction RD and the column direction CD cross over each other. Optionally, the row direction RD and the column direction CD are perpendicular to each other. Optionally, the row direction RD and the column direction CD cross over each other at an inclined angle that is not 90 degrees.

In some embodiments, the touch control structure is limited in a touch control area TCA and absent in a window region WR surrounded by the touch control area TCA. For example, the touch control structure may be a touch control structure in a display panel, where the touch control area TCA substantially overlaps with a display area of the display panel, and the window region WR is a region in the display panel having a hole configured for installing an accessory such as a camera lens or a fingerprint sensor. The display panel is configured to display an image in at least a portion of the touch control area TCA. In one example, in the window region WR, display elements of the display panel and the touch control structure are absent; in the display area or at least a portion of the touch control area TCA, both display elements of the display panel and the touch control structure are present.

Figure 14:
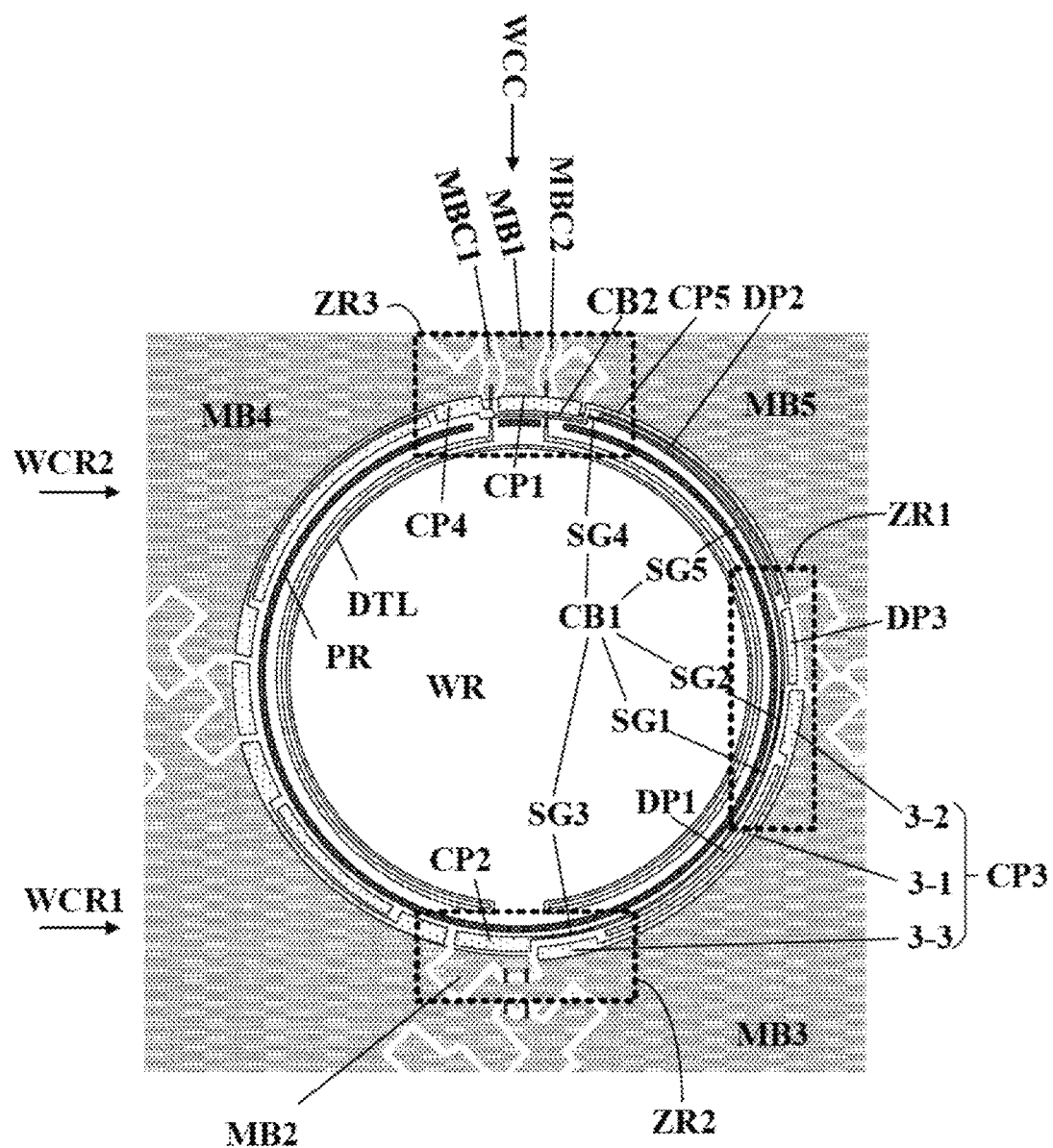
FIG. 14 is a zoom-in view of a touch control structure surrounding a window region in some embodiments according to the present disclosure.
Figure 15:
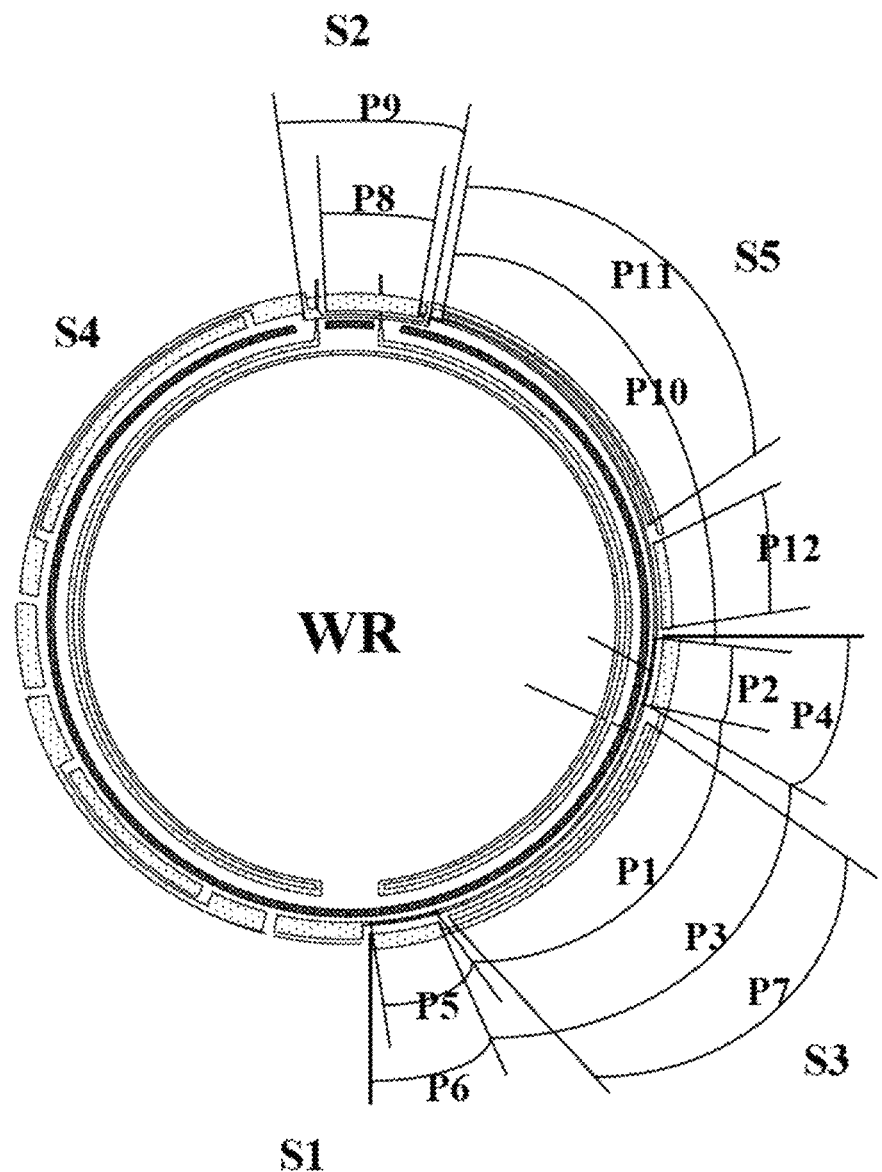
FIG. 15 is a schematic diagram illustrating a window region in some embodiments according to the present disclosure.

FIG. 14 is a zoom-in view of a touch control structure surrounding a window region in some embodiments according to the present disclosure. FIG. 15 is a schematic diagram illustrating a window region in some embodiments according to the present disclosure. Referring to FIG. 13 to FIG. 15, in some embodiments, a window-crossing column WCC of the plurality of second mesh electrodes TE2 includes a first mesh block MB1 and a second mesh block MB2 respectively on a first side S1 and a second side S2 of the window region WR; a first conductive plate CP1 directly connected to one or more mesh lines of the first mesh block MB1; a second conductive plate CP2 directly connected to one or more mesh lines of the second mesh block MB2; and a first conductive bridge CB1 connecting the first conductive plate CP1 and the second conductive plate CP2.

In some embodiments, the first conductive bridge CB1 includes a first segment SG1 and a second segment SG2. In some embodiments, the second segment SG2 is in a layer different from the first segment SG1, the first conductive plate CP1, and the second conductive plate CP2. In one example, the second segment SG2 is in a first layer, e.g., a first conductive material layer such as a first metallic material layer. In another example, the first segment SG1, the first conductive plate CP1, and the second conductive plate CP2 are in a second layer, e.g., a second conductive material layer such as a second metallic material layer.

Figure 16A:
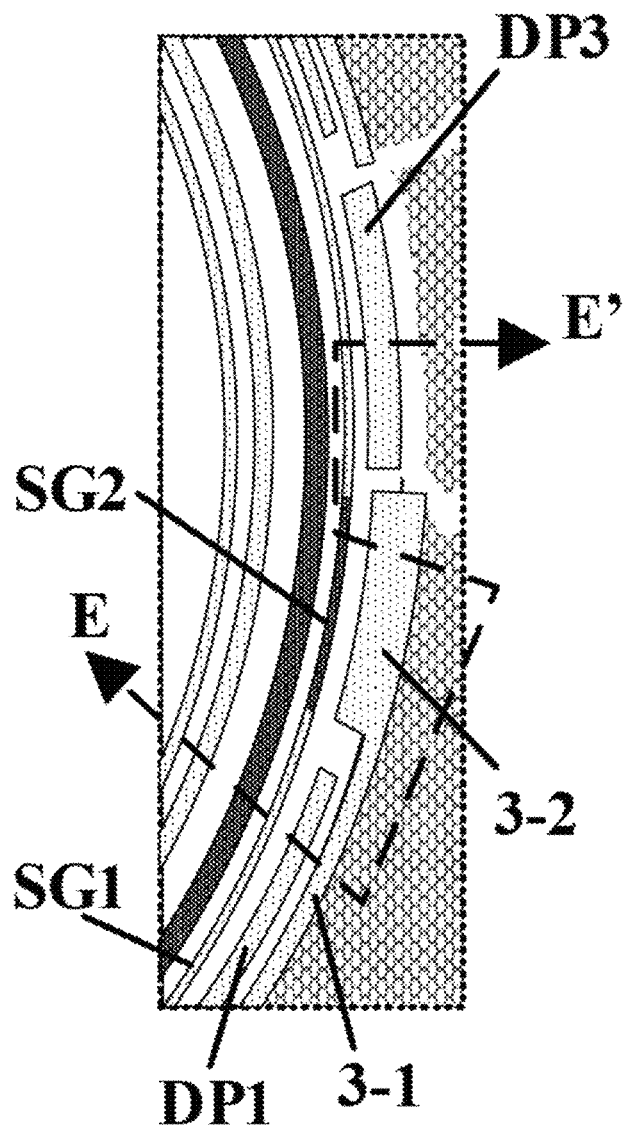
FIG. 16A is a zoom-in view of a first zoom-in region ZR1 in FIG. 14.
Figure 16B:
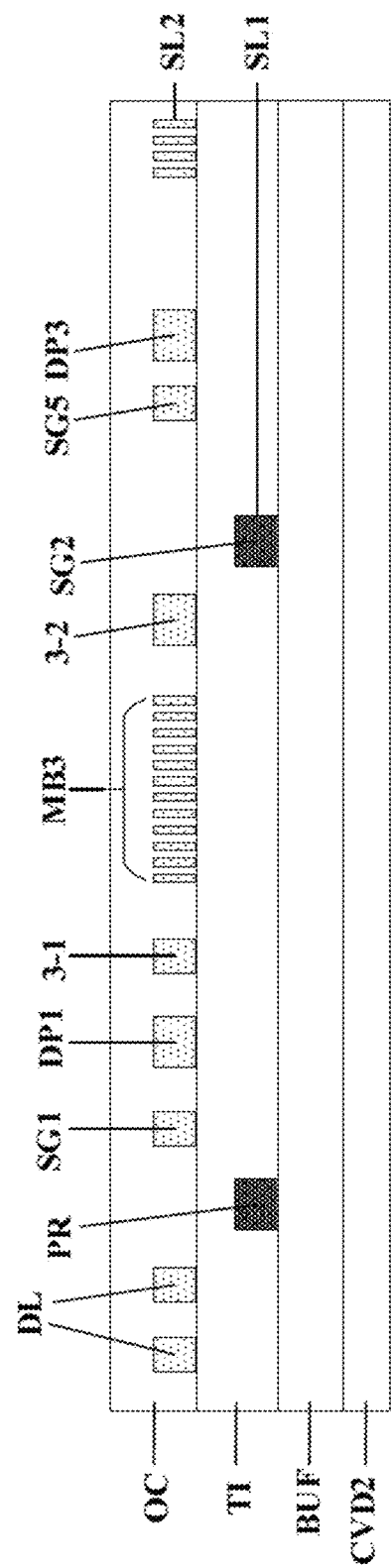
FIG. 16B is a cross-sectional view along an E-E' line in FIG. 16A.

FIG. 16A is a zoom-in view of a first zoom-in region ZR1 in FIG. 14. FIG. 16B is a cross-sectional view along an E-E' line in FIG. 16A. Referring to FIG. 16A and FIG. 16B, in some embodiments, the first segment SG1 is in a second layer SL1, and the second segment SG2 is in a first layer SL2. In one example as depicted in FIG. 16B, the touch control structure includes a buffer layer BUF on a second inorganic encapsulating sub-layer CVD2, the second inorganic encapsulating sub-layer CVD2 being a sub-layer of an encapsulating layer for encapsulating light emitting elements in a display apparatus having the touch control structure. In some embodiments, the touch control structure further includes a first layer SL1 on a side of the buffer layer BUF away from the second inorganic encapsulating sub-layer CVD2, a touch insulating layer TI on a side of the first layer SL1 away from the buffer layer BUF, a second layer SL2 on a side of the touch insulating layer TI away from the first layer SL1, and an overcoat layer OC on a side of the second layer SL2 away from the touch insulating layer TI. Optionally, mesh lines of the third mesh block MB3 are in the second layer SL2.

Referring to FIG. 13 to FIG. 15, in some embodiments, a first window-crossing row WCR1 of the plurality of first mesh electrodes TE1 includes a third mesh block MB3 on a third side S3 of the window region WR; and a third conductive plate CP3 directly connected to one or more mesh lines of the third mesh block MB3. The third side S3 is between the fast side S1 and the second side S2. The third conductive plate CP3 spaces apart the first conductive bridge CB1 from the third mesh block MB3.

Figure 17:
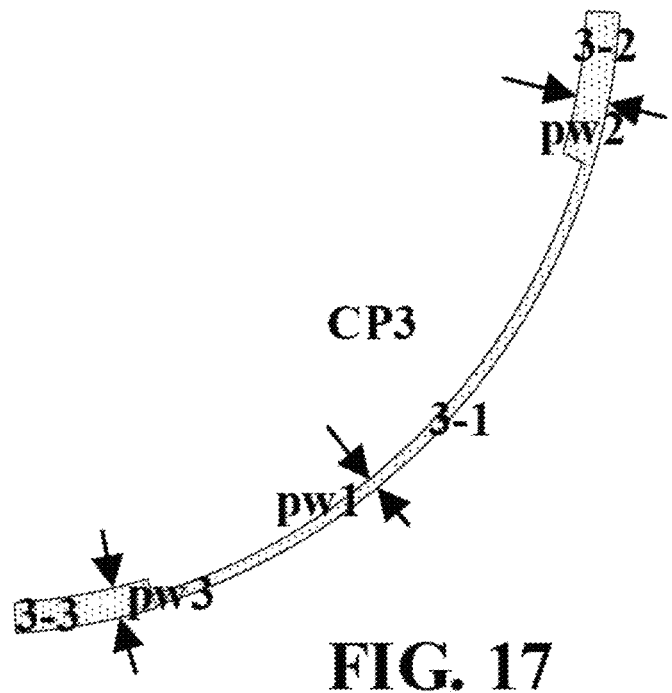
FIG. 17 is a schematic diagram illustrating the structure of a third conductive plate in some embodiments according to the present disclosure.

FIG. 17 is a schematic diagram illustrating the structure of a third conductive plate in some embodiments according to the present disclosure. Referring to FIG. 14 and FIG. 17, in some embodiments, the third conductive plate CP3 includes a first part 3-1 and a second part 3-2. The first part has a first shortest plate width pw1 along a direction from the first part 3-1 to the window region WR; the second part 3-2 has a second shortest plate width pw2 along a direction from the second part 3-2 to the window region WR. Optionally, the first shortest plate width pw1 is less than the second shortest plate width pw2.

The inventors of the present discover that, when a conductive bridge extends around a periphery of the window region, electrostatic discharge is prone to occur when the conductive bridge is in close proximity to a conductive plate directly connected to one or more mesh lines of a mesh block. For example, the first conductive bridge CB1 is in close proximity to the second part 3-2 of the third conductive plate CB3. The inventors of the present discover that, surprisingly and unexpected, the electrostatic discharge issue can be obviated by disposing a segment of the conductive bridge in close proximity to the conductive plate in a layer different from the conductive plate.

In some embodiments, as shown in FIG. 14, the second segment SG2 is in close proximity to a second part 3-2 of the third conductive plate CP3. Accordingly, in some embodiment, in the touch control structure according to the present disclosure, the second segment SG2 is in a layer different from the third conductive plate CP3. Referring to FIG. 16B, the second segment SG2 is in the first layer SL1, whereas the first part 3-1 and the second part 3-2 of the third conductive plate, and the first segment SL1 are in the second layer SL2.

Referring to FIG. 15, in some embodiments, the first segment SG1 and the second segment SG2 are respectively around a first portion P1 and a second portion P2 of the periphery of the window region WR; the first part 3-1 and the second part 3-2 are respectively around a third portion P3 and a fourth portion P4 of the periphery of the window region WR; the first portion P1 is at least partially overlapping with the third portion P3; and the second portion P2 is at least partially overlapping with the fourth portion P4. Optionally, the second portion P2 and the fourth portion P4 substantially (e.g., 80%, 85%, 90%, 95%, 99%, or 100%) overlap with each other. Optionally, the first portion P1 and the third portion P3 substantially (e.g., 80%, 85%, 90%, 95%, 99%, or 100%) overlap with each other.

In some embodiments, and referring to FIG. 14 and FIG. 17, the third conductive plate further includes a third part 3-3, the first part 3-1 between the second part 3-2 and the third part 3-3. Optionally, the second part 3-2 and the third part 3-3 are connected through the first part 3-1. Optionally, the second part 3-2 is directly connected to the first part 3-1, and the third part 3-3 is directly connected to the first part 3-1. Referring to FIG. 14, the first conductive plate CP1 further includes a third segment SG3, the first segment SG1 between the second segment SG2 and the third segment SG3 Optionally, the second segment SG2 and the third segment SG3 are connected through the first segment SG1. Optionally, the second segment SG2 is directly connected to the first segment SG1, and the third segment SG3 is directly connected to the first segment SG1.

In some embodiments, the third segment SG3 is in a same layer as the second segment SG2, and is in a layer different from the first segment SG1, the first conductive plate CP1, the second conductive plate CP2, and the third conductive plate CP3. As used herein, the term "same layer" refers to the relationship between the layers simultaneously formed in the same step. In one example, the second segment SG2 and the third segment SG3 are in a same layer when they are formed as a result of one or more steps of a same patterning process performed in a material deposited in a same deposition process. In another example, the second segment SG2 and the third segment SG3 can be formed in a same layer by simultaneously performing the step of forming the second segment SG2 and the step of forming the third segment SG3. The term "same layer" does not always mean that the thickness of the layer or the height of the layer in a cross-sectional view is the same.

Figure 18A:
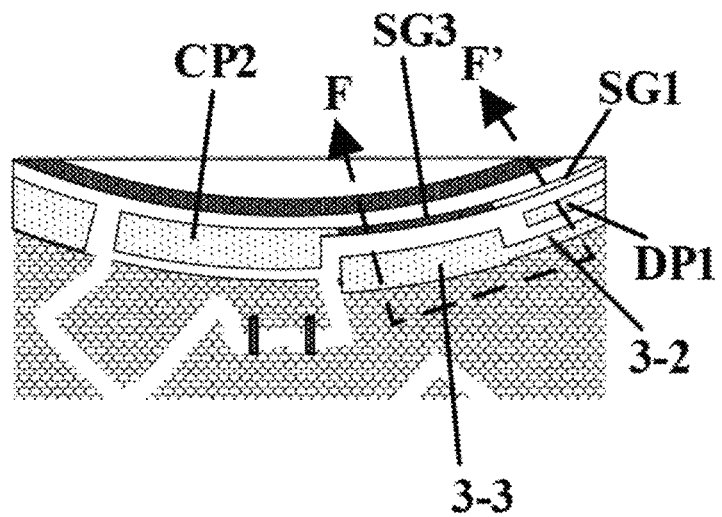
FIG. 18A is a zoom-in view of a second zoom-in region ZR2 in FIG. 14.
Figure 18B:
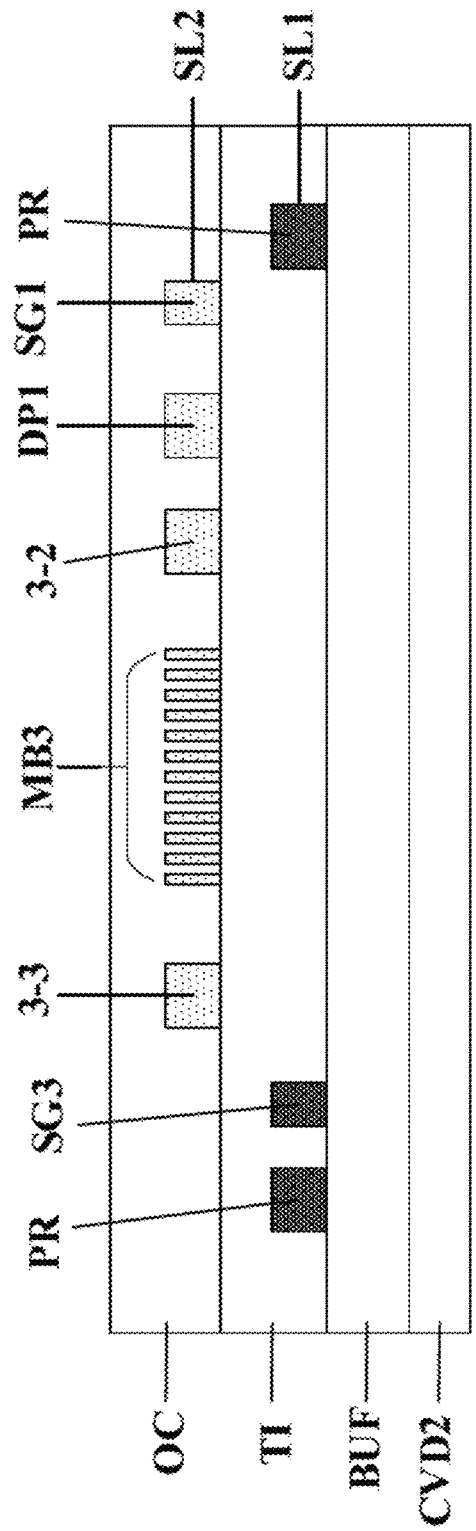
FIG. 18B is a cross-sectional view along an F-F' line in FIG. 18A.

FIG. 18A is a zoom-in view of a second zoom-in region ZR2 in FIG. 14. FIG. 18B is a cross-sectional view along an F-F' line in FIG. 18A. Referring to FIG. 18A, FIG. 18B, FIG. 16A, and FIG. 16B, the second segment SG2 and the third segment SG3 are in the first layer SL1. The first segment SG1, the first part 3-1, the second part 3-2, the third part 3-3, mesh lines of the third mesh block MB3, are in the second layer SL2.

Referring to FIG. 15, in some embodiments, the third segment SG3 is around a fifth portion P5 of the periphery of the window region WR; the third part 3-3 is around a sixth portion P6 of the periphery of the window region WR; the fifth portion P5 is at least partially overlapping with the sixth portion P6. Optionally, the fifth portion P5 and the sixth portion P6 substantially (e.g., 80%, 85%, 90%, 99%, or 100%) overlap with each other.

Referring to FIG. 14 and FIG. 17, in some embodiments, the first part has a first shortest plate width pw1 along a direction from the first part 3-1 to the window region WR; the second part 3-2 has a second shortest plate width pw2 along a direction from the second part 3-2 to the window region WR; and the third part 3-3 has a third shortest plate width pw3 along a direction from the third part 3-3 to the window region WR. Optionally, the first shortest plate width pw1 is less than the second shortest plate width pw2; and the first shortest plate width pw1 is less than the third shortest plate width pw3.

Referring to FIG. 14, FIG. 16A, FIG. 16B, FIG. 18A, and FIG. 18B, the touch control structure in some embodiments further includes a first dummy plate DP1 insulated from the first conductive bridge CB1 and the third conductive plate CP3, and spacing part a portion of the first conductive bridge CB1 and a portion of the third conductive plate CP3. Referring to FIG. 15, the first dummy plate DP1 is around a seventh portion P7 of the periphery of the window region WR. Optionally, the seventh portion P7 is at least partially overlapping with the third portion P3, and is non-overlapping with the fourth portion P4 and the sixth portion P6. Optionally, the third portion P3 and the seventh portion P7 substantially (e.g., 80%, 85%, 90%, 95%, 99%, or 100%) overlap with each other.

In some embodiments, and referring to FIG. 14, FIG. 16A, FIG. 16B, FIG. 18A, and FIG. 18B, in an orthographic projection of the touch control structure on a base substrate (e.g., the second inorganic encapsulating sub-layer CVD2), an orthographic projection of a conductive component on the base substrate is absent in a space between an orthographic projection of the second segment SG2 on the base substrate and an orthographic projection of the second part 3-2 on the base substrate. Optionally, in the orthographic projection of the touch control structure on the base substrate, an orthographic projection of a conductive component on the base substrate is absent in a space between an orthographic projection of the third segment SG3 on the base substrate and an orthographic projection of the third part 3-3 on the base substrate. Optionally, in the orthographic projection of the touch control structure on the base substrate, an orthographic projection of the first dummy plate DP1 on the base substrate, is in a space between an orthographic projection of the first segment SG1 on the base substrate and an orthographic projection of the first part 3-1 on the base substrate.

In some embodiments, and referring to FIG. 14, a second window-crossing row WCR2 of the plurality of first mesh electrodes TE1 includes a fourth mesh block MB4 and a fifth mesh block MB5 respectively on a fourth side S4 ants a fifth side S5 of the window region. Optionally, the second side S2 is between the fourth side S4 and the fifth side S5. Optionally, the fifth side S5 is between the second side S2 and the third side S3. Optionally, the fourth side S4 is between the first side S1 and the second side S2.

In some embodiments, the second window-crossing row WCR2 of the plurality of first mesh electrodes TE1 further includes a fourth conductive plate CP4 directly connected to one or more mesh lines of the fourth mesh block MB4; a fifth conductive plate CP5 directly connected to one or more mesh lines of the fifth mesh block MB5; and a second conductive bridge CB2 connecting the fourth conductive plate CP4 and the fifth conductive plate CP5. Referring to FIG. 15, the first conductive plate CP1 is around an eighth portion P8 of the periphery of the window region WR and the second conductive bridge CB2 is around a ninth portion P9 of the periphery of the window region WR. Optionally, the eighth portion P8 is at least partially overlapping with the ninth portion P9. Optionally, the eighth portion P8 and the ninth portion P9 substantially (e.g., 80%, 85%, 90%, 95%, 99%, or 100%) overlap with each other.

Figure 19:
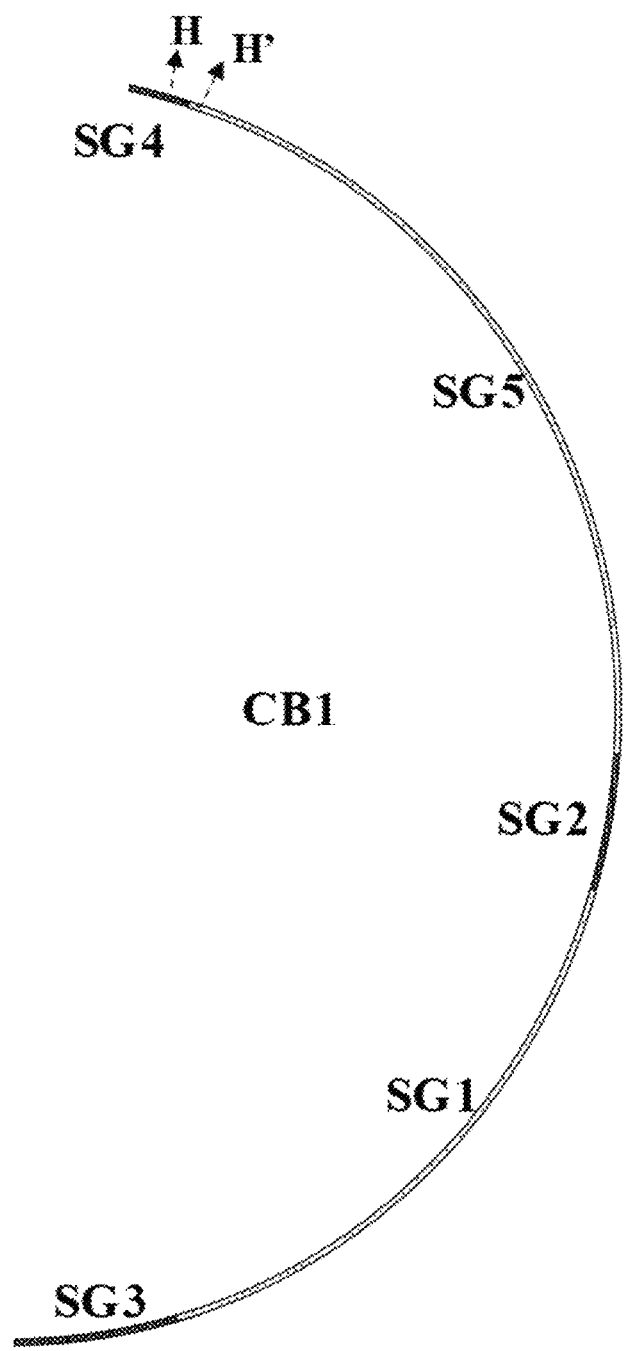
FIG. 19 is a schematic diagram illustrating the structure of a first conductive bridge in some embodiments according to the present disclosure.
Figure 20A:
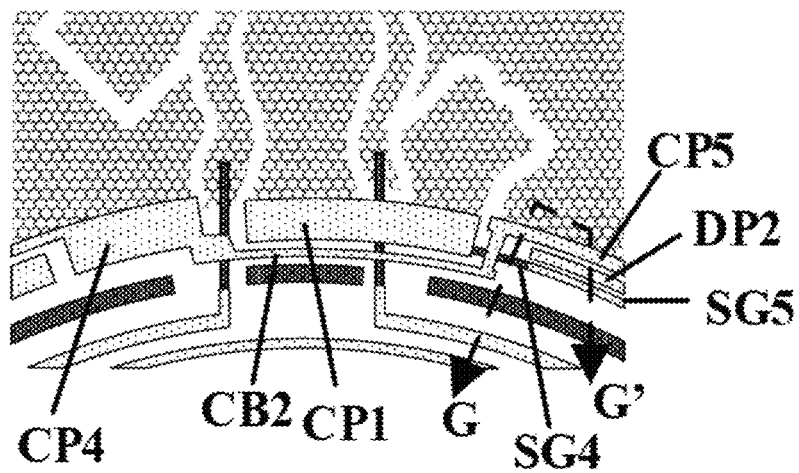
FIG. 20A is a zoom-in view of a third zoom-in region ZR3 in FIG. 14.
Figure 20B:
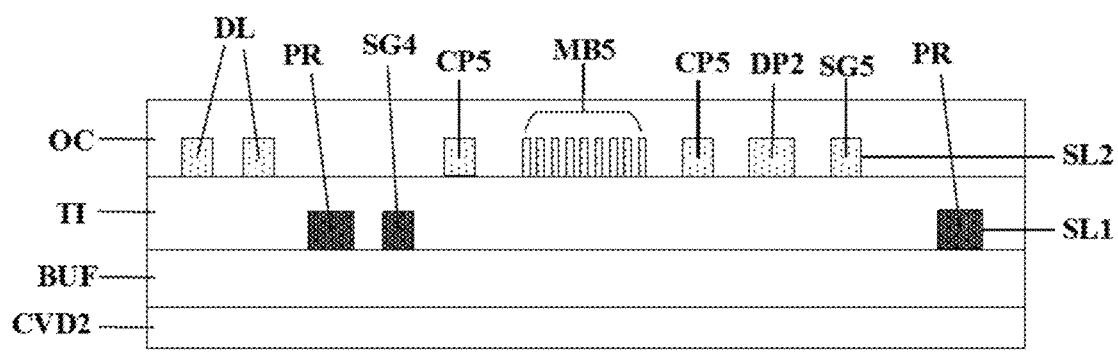
FIG. 20B is a cross-sectional view along a G-G' line in FIG. 20A.

FIG. 19 is a schematic diagram illustrating the structure of a first conductive bridge in some embodiments according to the present disclosure. Referring to FIG. 14 and FIG. 19, in some embodiments, the first conductive bridge CB1 further includes a fourth segment SG4. FIG. 20A is a zoom-in view of a third zoom-in region ZR3 in FIG. 14. FIG. 20B is a cross-sectional view along a G-G' line in FIG. 20A. Referring to FIG. 14, FIG. 20A, and FIG. 20B, the fourth segment SG4 in some embodiments crosses over a portion of the second conductive bridge CB2 to connect with the first conductive plate CP1.

In some embodiments, the fourth segment SG4 is in a same layer as the second segment SG2 and the third segment SG3, and is in a layer different from the first segment SG1, the first conductive plate CP1, the second conductive plate CP2, and the third conductive plate CP3. Optionally, the fourth segment SG4 is in a layer different from the first segment SG1, the first conductive plate CP1, the second conductive plate CP2, the fourth conductive plate CP4, the fifth conductive plate CP5, and the second conductive bridge CB2 optionally, mesh lines of the fifth mesh block MB5 are in the second layer SL2.

Referring to FIG. 14, FIG. 19, FIG. 20A, and FIG. 20B. the first conductive bridge in some embodiments further includes a fifth segment SG5 between the fourth segment SG4 and the second segment SG2. Optionally, the second segment SG2 and the fourth segment SG4 are connected through the fifth segment SG5. Optionally, the second segment SG2 is directly connected to the fifth segment SG5, and the fourth segment SG4 is directly connected to the fifth segment SG5.

Figure 21:
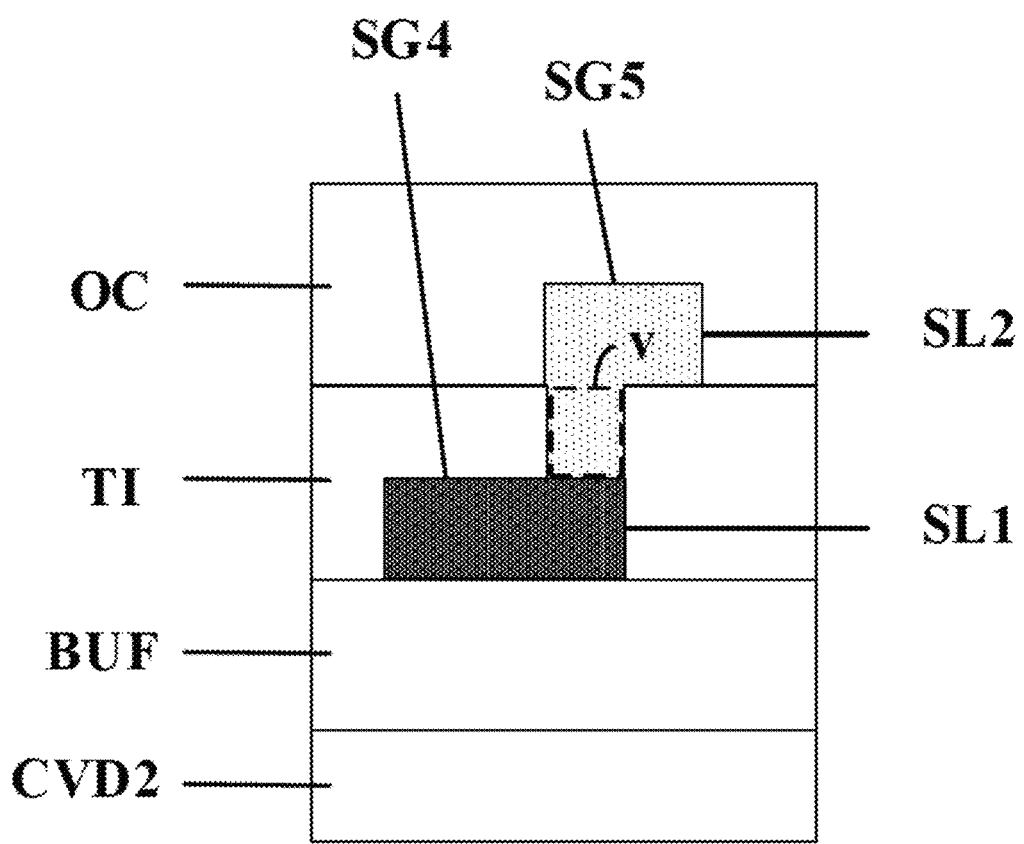
FIG. 21 is a cross-sectional view along an H-H' line in FIG. 19.

FIG. 21 is a cross-sectional view along an H-H' line in FIG. 19. Referring to FIG. 19, in some embodiments, the fifth segment SG5 is directly connected to the fourth segment SG4 through a via v extending through the touch insulating layer TI. The connections between other respective segments of the first conductive bridge CB1 can be similarly implemented. For example, the connection between the first segment SG1 and the second segment SG2, the connection between the first segment SG1 and the third segment SG3, or the connection between the second segment SG2 and the fits segment SG5, can be implemented by respective vias extending through the touch insulating layer TI.

Referring to FIG. 20A and FIG. 20B, in some embodiments, the fifth segment SG5 is in a same layer as the first segment SG1, the first conductive plate CP1, the second conductive plate CP2, the third conductive plate CP3, and the second conductive bridge CB2. Optionally, the fifth segment SG5 is in a layer different from the second segment SG2 and the fourth segment SG4.

Referring to FIG. 14, FIG. 20A and FIG. 20B, in some embodiments, the touch control structure further includes a second dummy plate DP2 insulated from the fifth conductive plate CP5 and the fifth segment SG5, and spacing part a portion of the fifth conductive plate CP5 and a portion of the fifth segment SG5. Referring to FIG. 15, in some embodiments, the fifth segment SG5 is around a tenth portion P10 of the periphery of the window region WR. Optionally, the second dummy plate DP2 is around an eleventh portion P11 of the periphery of the window region WR. Optionally, the tenth portion P10 is at least partially overlapping with the eleventh portion P11. Optionally, a sub-portion of the tenth portion P10 is non-overlapping with the eleventh portion P11.

Referring to FIG. 14, FIG. 15, FIG. 16A, and FIG. 16B, the touch control structure in some embodiments further includes a third dummy plate DP3 around a twelfth portion P12 of the periphery of the window region WR. Optionally, the twelfth portion P12 is between the eleventh portion P11 and the second portion. Optionally, the twelfth portion P12 is non-overlapping with the eleventh portion P11, and is non-overlapping with the second portion P2. Optionally, the twelfth portion P12 is at least partially overlapping with the tenth portion P10. Optionally, a combination of the eleventh portion P11 and the twelfth portion P12 substantially (e.g., 80%, 85%, 90%, 95%, 99%, or 100%) overlap with the tenth portion P10.

Referring to FIG. 14, the touch control structure in some embodiments further includes a protective ring PR substantially (e.g., 80%, 85%, 90%, 95%, 99%, or 100%) surrounding the window region WR. Referring to FIG. 14, in some embodiments, the first conductive plate CP1, the second conductive plate CP2, and the first conductive bridge CB1 are respectively around portions of the protective ring PR. Referring to FIG. 14, FIG. 16B, FIG. 18B, and FIG. 20B, in some embodiments, the protective ring PR is in a same layer as the second segment SG2, the third segment SG3, and the fourth segment SG4. Optionally, the protective ring PR is in a layer different from the first segment SG1, the fifth segment SG5, the first conductive plate CP1, the second conductive plate CP2, the third conductive plate CP3, the fourth conductive plate CP4, and the fifth conductive plate CP5.

Referring to FIG. 14, the touch control structure in some embodiments further includes a detection line DTL substantially (e.g., 80%, 85%, 90%, 95%, 99%, or 100%) surrounding the window region WR. FIG. 5B is a schematic diagram illustrating the structure of a detection line in some embodiments according to the present disclosure. Referring to FIG. 14 and FIG. 5B, in some embodiments, the detection line DTL includes contiguously a first line portion LP1 extending clock-wisely around a first half (e.g., a right half) of a periphery of the window region WR, a second line portion LP2 extending counter-clock-wisely around the first half of the periphery of the window region WR and a second half of the periphery of the window region WR2, and a third line portion LP3 extending clock-wisely around the second half of the periphery of the window region WR. As used herein, the term "first half" and "second half" is not limited to exact half, but also include less than half or greater than half.

Referring to FIG. 14 and FIG. 5B, the touch control structure in some embodiments further includes a sixth mesh block MBC1 and a seventh mesh block MBC2 respectively on two sides of the first mesh block MB1; and a first lead line LL1 connecting the sixth mesh block MBC1 to the third line portion LP3; and a second lead line LL2 connecting the seventh mesh block MBC2 to the first line portion LP1.

In some embodiments, the first line portion LP1, the second line portion LP2, the third line portion LP3 are in a same layer as the first segment SG1, the fifth segment SG5, the first conductive plate CP1, the second conductive plate CP2, the third conductive plate CP3, the fourth conductive plate CP4, and the fifth conductive plate CP5. In some embodiments, the first lead line LL1 and the second lead line LL2 are in a same layer as the second segment SG2, the third segment SG3, and the fourth segment SG4.

In some embodiments, the first conductive bridge CB1 (or segments thereof) has a line width in a range of 5 μm to 15 μm, e.g., 5 μm to 7 μm, 7 μm to 9 μm, 9 μm to 11 μm, 11 μm to 13 μm, or 13 μm to 15 μm. Optionally, the first conductive bridge CB1 (or segments thereof) has a line width of 10 μm.

In some embodiments, the second conductive bridge CB2 (or segments thereof) has a line width in a range of 10 μm to 20 μm, e.g., 10 μm to 12 μm, 12 μm to 14 μm, 14 μm to 16 μm, 16 μm to 18 μm, or 18 μm to 20 μm. Optionally, the second conductive bridge CB2 (or segments thereof) has a line width of 15 μm.

In some embodiments, the first shortest plate width pw1 is in a range of 20 μm to 40 μm, e.g., 20 μm to 25 μm, 25 μm to 30 μm, 30 μm to 35 μm, or 35 μm to 40 μm. Optionally, the first shortest plate width pw1 is 30 μm.

In some embodiments, the second shortest plate width pw2 is in a range of 75 μm to 115 μm, e.g., 75 μm to 85 μm, 85 μm to 95 μm, 95 μm to 105 μm, or 105 μm to 115 μm. Optionally, the second shortest plate width pw2 is 95 μm.

In some embodiments, the third shortest plate width pw3 is in a range of 75 μm to 115 μm, e.g., 75 μm to 85 μm, 85 μm to 95 μm, 95 μm to 105 μm, or 105 μm to 115 μm. Optionally, the third shortest plate width pw3 is 95 μm.

Optionally, a ratio of the first shortest plate width pw1 to the second shortest plate width pw2 is a range of 1:2 to 1:4, e.g., 1:2 to 1:2.5, 1:2.5 to 1:3, 1:3 to 1:3.5, or 1:3.5 to 1:4. Optionally, a ratio of the first shortest plate width pw1 to the third shortest plate width pw3 is a range of 1:2 to 1:4, e.g., 1:2 to 1:2.5, 1:2.5 to 1:3, 1:3 to 1:3.5, or 1:3.5 to 1:4.

In some embodiments, the first conductive plate has a shortest plate width along a direction from the first conductive plate to the window region in a range of 80 μm to 160 μm, e.g., 80 μm to 100 μm, 100 μm to 120 μm, 120 μm to 140 μm, or 140 μm to 160 μm. Optionally, the shortest plate width is 120 μm.

In some embodiments, the second conductive plate has a shortest plate width along a direction from the second conductive plate to the window region in a range of 80 μm to 160 μm, e.g., 80 μm to 100 μm, 100 μm to 120 μm, 120 μm to 140 μm, or 140 μm to 160 μm. Optionally, the shortest plate width is 120 μm.

In some embodiments, the first dummy plate has a shortest plate width along a direction from the first dummy plate to the window region in a range of 30 μm to 70 μm, e.g., 30 μm to 40 μm, 40 μm to 50 μm, 50 μm to 60 μm, or 60 μm to 70 μm. Optionally, the shortest plate width is 50 μm.

In some embodiments, the second dummy plate has a shortest plate width along a direction from the second dummy plate to the window region in a range of 20 μm to 40 μm, e.g., 20 μm to 25 μm, 25 μm to 30 μm, 30 μm to 35 μm, or 35 μm to 40 μm. Optionally, the shortest plate width is 30 μm.

In some embodiments, the fourth conductive plate has a shortest plate width along a direction from the fourth conductive plate to the window region in a range of 5 μm to 15 μm, e.g., 5 μm to 7 μm, 7 μm to 9 μm, 9 μm to 11 μm, 11 μm to 13 μm, or 13 μm to 15 μm. Optionally, the shortest plate width is 10 μm.

In some embodiments, the fifth conductive plate has a shortest plate width along a direction from the fifth conductive plate to the window region in a range of 30 μm to 70 μm, e.g., 30 μm to 40 μm, 40 μm to 50 μm, 50 μm to 60 μm, or 60 μm to 70 μm. Optionally, the shortest plate width is 50 μm.

In some embodiments, the protective ring has a shortest plate width along a direction from the protective ring to the window region in a range of 25 μm to 65 μm, e.g., 25 μm to 35 μm, 35 μm to 45 μm, 45 μm to 55 μm, or 55 μm to 65 μm. Optionally, the shortest plate width is 45 μm.

In some embodiments, the detection line (or line portions thereof) has a line width in a range of 2.5 μm to 6.5 μm, e.g., 2.5 μm to 3.5 μm, 3.5 μm to 4.5 μm, 4.5 μm to 5.5 μm, or 5.5 μm to 6.5 μm. Optionally, the first conductive bridge CB1 (or segments thereof) has a line width of 4.5 μm.

In some embodiments, the first lead line or the second lead line has a line width in a range of 5 μm to 15 μm, e.g., 5 μm to 7 μm, 7 μm to 9 μm, 9 μm to 11 μm, 11 μm to 13 μm, or 13 μm to 15 μm. Optionally, the first lead line or the second lead line has a line width of 10 μm.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated.

It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising:
   touch electrodes at least partially in a display area, wherein the touch electrodes are absent in a window region that is at least partially surrounded by the display area; and
   a crack detection circuit;
   wherein the crack detection circuit comprising:
   an integrated circuit; and
   a first conduction loop electrically connected to the integrated circuit;
   wherein the first conduction loop comprises a window region crack detection line substantially surrounding the window region; and
   at least a portion of the first conduction loop comprises a first metal line in a first layer and a second metal line in a second layer, the first metal line connected to the second metal through a via extending through a touch insulating layer;
   wherein the first conduction loop further comprises a first connecting mesh block and a second connecting mesh block respectively electrically connected to a first terminal and a second terminal of a window region crack detection line;
   the first connecting mesh block and the second connecting mesh block respectively extend through a portion of a touch control area of the display panel; and
   the first connecting mesh block and the second connecting mesh block are in the second layer, the second layer further comprising mesh blocks of mesh electrodes.

2. The display panel of claim 1, wherein the window region crack detection line comprises contiguously a first line portion extending clock-wisely around a first portion of a periphery of the window region, a second line portion extending counter-clock-wisely around the first portion of the periphery of the window region and a second portion of the periphery of the window region, and a third line portion extending clock-wisely around the second portion of the periphery of the window region.

3. The display panel of claim 1, wherein the window region crack detection line comprises contiguously a first line portion extending counter-clock-wisely around a first section of a periphery of the window region, a second line portion extending clock-wisely around the first section of the periphery of the window region and a second section of the periphery of the window region, and a third line portion extending counter-clock-wisely around the second section of the periphery of the window region.

4. The display panel of claim 1, wherein a contour of at least one of the first connecting mesh block or the second connecting mesh block has an undulating shape or a zig-zag shape; and
   at least one of the first connecting mesh block or the second connecting mesh block is internal to a mesh block of the touch electrodes or between adjacent mesh blocks of the touch electrodes.

5. The display panel of claim 4, wherein the first conduction loop further comprises a third lead line connecting the first connecting mesh block to a first touch crack detection line and a fourth lead line connecting the second connecting mesh block to a second touch crack detection line, the first touch crack detection line and the second touch crack detection line being at least partially in the second layer and in a peripheral area of the display panel, the third lead line and the fourth lead line being in the first layer spaced apart from the second layer by the touch insulating layer;
   the third lead line connects to the first connecting mesh block through a via extending through the touch insulating layer; and
   the fourth lead line connects to the second connecting mesh block through a via extending through the touch insulating layer.

6. The display panel of claim 1, wherein the first conduction loop further comprises a first lead line connecting the first terminal of the window region crack detection line to the first connecting mesh block and a second lead line connecting the second terminal of the window region crack detection line to the second connecting mesh block;
   the first lead line and the second lead line are in the first layer spaced apart from the second layer by the touch insulating layer;
   the first lead line connects to the first connecting mesh block through a via extending through the touch insulating layer; and
   the second lead line connects to the second connecting mesh block through a via extending through the touch insulating layer.

7. The display panel of claim 6, further comprising mesh blocks respectively around the window region, conductive plates respectively connected to the mesh blocks, and conductive bridges, wherein a respective conductive plate directly connected to a respective mesh block, and a respective conductive bridge connecting two adjacent conductive plates;
   wherein the first lead line and the second lead line respectively cross over at least one of a conductive plate or a conductive bridge.

8. The display panel of claim 1, wherein the first conduction loop further comprises:
   a first panel crack sub-loop that continuously extends from a first sub-area of a peripheral area into a third sub-area of the peripheral area of the display panel, and then extends from the third sub-area back to the first sub-area; and
   a first touch crack detection line and a second touch crack detection line respectively electrically connected to a first terminal and a second terminal of a window region crack detection line;
   wherein a first terminal of the first panel crack sub-loop is connected to the second touch crack detection line;

a second terminal of the first panel crack sub-loop is connected to the integrated circuit;
the first touch crack detection line and the second touch crack detection line space apart the first panel crack sub-loop and the display area;
the first touch crack detection line extends from a first sub-area through a second sub-area into a third sub-area of a peripheral area of the display panel; and
the second touch crack detection line extends from the third sub-area through the second sub-area back into the first sub-area.

9. The display panel of claim 8, wherein the crack detection circuit further comprises a first connecting line connecting the first touch crack detection line to a source electrode of a switching transistor, a drain electrode of the switching transistor connected to a data line.

10. The display panel of claim 8, wherein the second terminal of the first panel crack sub-loop is connected to a first pin in the integrated circuit, which is in turn connected to a second pin in a bonding area for bonding a flexible printed circuit.

11. The display panel of claim 1, wherein the crack detection circuit further comprises a second conduction loop electrically connected to the integrated circuit;
the second conduction loop comprises a third touch crack detection line and a fourth touch crack detection line;
the first conduction loop and the second conduction loop are spaced apart from each other, at least a portion of the first conduction loop and at least a portion of the second conduction loop are on opposite sides relative to the display area;
the third touch crack detection line and the fourth touch crack detection line respectively extend from a first sub-area through a fourth sub-area into a third sub-area of a peripheral area of the display panel;
the third touch crack detection line and the fourth touch crack detection line are connected to each other in the third sub-area; and
the third touch crack detection line and the fourth touch crack detection line are at least partially in the second layer, the second layer further comprising mesh blocks of mesh electrodes.

12. The display panel of claim 11, wherein the second conduction loop further comprises a second panel crack sub-loop that continuously extends from the first sub-area through the fourth sub-area into the third sub-area of a peripheral area of the display panel and back to the first sub-area;
wherein a first terminal of the second panel crack sub-loop is connected to the fourth touch crack detection line;
a second terminal of the second panel crack sub-loop is connected to the integrated circuit; and
the second panel crack sub-loop is in a layer in a thin film transistor array substrate.

13. The display panel of claim 1, wherein the crack detection circuit further comprises a third conduction loop continuously extending, sequentially, from a first corner region of a first sub-area, to a second sub-area, to a third sub-area, to the second sub-area, to the first sub-area, to a fourth sub-area, to the third sub-area, to the fourth sub-area, and back to a second corner region of the first sub-area;
the first sub-area, the second sub-area, the third sub-area, and the fourth sub-area are respectively sub-areas of a peripheral area in the display panel;

a first terminal and a second terminal of the third conduction loop are respectively connected to two bonding pins in a bonding area for bonding a flexible printed circuit; and
the first conduction loop and the second conduction loop space apart the third conduction loop from the display area.

14. A display apparatus, comprising the display panel of claim 1, and a flexible printed circuit connected to the integrated circuit.

15. A display panel, comprising:
touch electrodes at least partially in a display area, wherein the touch electrodes are absent in a window region that is at least partially surrounded by the display area; and
a crack detection circuit;
wherein the crack detection circuit comprising:
an integrated circuit; and
a first conduction loop electrically connected to the integrated circuit;
wherein the first conduction loop comprises a window region crack detection line substantially surrounding the window region; and
at least a portion of the first conduction loop comprises a first metal line in a first layer and a second metal line in a second layer, the first metal line connected to the second metal through a via extending through a touch insulating layer;
wherein the first conduction loop further comprises a first touch crack detection line and a second touch crack detection line respectively electrically connected to a first terminal and a second terminal of the window region crack detection line;
the first touch crack detection line extends from a first sub-area through a second sub-area into a third sub-area of a peripheral area of the display panel;
the second touch crack detection line extends from the third sub-area through the second sub-area back into the first sub-area; and
the first touch crack detection line and the second touch crack detection line are at least partially in the second layer, the second layer further comprising mesh blocks of mesh electrodes.

16. The display panel of claim 15, wherein the first touch crack detection line and the second touch crack detection line are on a same side relative to the display area.

17. The display panel of claim 15, wherein the first touch crack detection line, the second touch crack detection line, the window region crack detection line are parts of a first touch crack sub-loop that continuously extends from a first sub-area of a peripheral area into an area substantially surrounding the window region, and then extends from the area substantially surrounding the window region back to the first sub-area.

18. The display panel of claim 17, wherein the first touch crack detection line and the second touch crack detection line are in the second layer, the second layer further comprising mesh blocks of mesh electrodes.

19. A method of detecting crack in a display panel comprising touch electrodes at least partially in the display area, wherein the touch electrodes are absent in a window region that is at least partially surrounded by the display area, the method comprising:
providing a first conduction loop;
electrically connecting a first terminal of the first conduction loop to an integrated circuit;

electrically connecting a second terminal of the first conduction loop to a source electrode of a switching transistor;

electrically connecting a drain electrode of the switching transistor to a data line;

providing, by the integrated circuit, a voltage signal to the first terminal of the first conduction loop while turning on the switching transistor; and determining presence or absence of a crack in a region having the first conduction loop based on light emitting status of light emitting elements connected to the data line;

wherein providing the first conduction loop comprises extending a window region crack detection line of the first conduction loop into a region substantially surrounding the window region; and determining presence or absence of the crack comprises determining presence or absence of a crack in the region substantially surrounding the window region.

\* \* \* \* \*